United States Patent
Meylan

(10) Patent No.: US 10,854,656 B2
(45) Date of Patent: Dec. 1, 2020

(54) SHORT-WAVE INFRARED DETECTOR ARRAY AND METHOD FOR THE MANUFACTURING THEREOF

(71) Applicant: IRIS Industries SA, Saint-Aubin-Sauges (CH)

(72) Inventor: Claude Meylan, Saint-Aubin-Sauges (CH)

(73) Assignee: IRIS INDUSTRIES SA, Saint-Aubin-Sauges (CH)

(*) Notice: Subject to any disclaimer, the term of this patent is extended or adjusted under 35 U.S.C. 154(b) by 0 days.

(21) Appl. No.: 16/487,547

(22) PCT Filed: Apr. 24, 2017

(86) PCT No.: PCT/EP2017/059675
§ 371 (c)(1),
(2) Date: Aug. 21, 2019

(87) PCT Pub. No.: WO2018/153503
PCT Pub. Date: Aug. 30, 2018

(65) Prior Publication Data
US 2020/0058697 A1    Feb. 20, 2020

Related U.S. Application Data

(60) Provisional application No. 62/462,454, filed on Feb. 23, 2017.

(51) Int. Cl.
*H01L 27/146*    (2006.01)
(52) U.S. Cl.
CPC .... *H01L 27/14634* (2013.01); *H01L 27/1465* (2013.01); *H01L 27/1469* (2013.01);
(Continued)

(58) Field of Classification Search
USPC ........................................................ 257/292
See application file for complete search history.

(56) References Cited

U.S. PATENT DOCUMENTS

| 8,357,960 B1 | 1/2013 | Dutta | |
| 2005/0167709 A1* | 8/2005 | Augusto | ........... H01L 27/14643 |
| | | | 257/292 |

(Continued)

FOREIGN PATENT DOCUMENTS

WO    2006060599 A2    6/2006

OTHER PUBLICATIONS

Oehme M et al, "GeSn p-i-n detectors integrated on Si with up to 4% Sn", Applied Physics Letters, p. 1-4 (Oct. 2012).

*Primary Examiner* — Igwe U Anya
(74) *Attorney, Agent, or Firm* — Browdy and Neimark, PLLC

(57) ABSTRACT

The invention relates to short-wave infrared (SWIR) detector arrays, and methods for forming such arrays, comprising a light conversion layer (10) having a germanium-tin alloy composition. The shortwave infrared (SWIR) detector array comprises an absorber wafer (II) and a readout wafer (I). The absorber wafer (II) comprises a SWIR conversion layer (10) which has a $Ge_{1-x}Sn_x$ alloy composition. The SWIR conversion layer (10) may have an internal structure comprising an array of rods (12) extending between a patterned support layer (40) and a doped silicon layer (10c). The detector comprises also a readout wafer (I) including an array of charge collecting areas and a readout electric circuit. The readout wafer (I) and the absorber wafer (II) are bonded by a low temperature bonding technique. The invention also relates to methods of fabrication of the SWIR detector array and to SWIR detector array applications such as a multi/hyperspectral LIDAR imaging systems.

23 Claims, 8 Drawing Sheets

(52) U.S. Cl.
CPC .. *H01L 27/14607* (2013.01); *H01L 27/14687* (2013.01); *H01L 27/14692* (2013.01); *H01L 27/14627* (2013.01)

(56) References Cited

U.S. PATENT DOCUMENTS

| | | |
|---|---|---|
| 2006/0194415 A1 | 8/2006 | Lee et al. |
| 2016/0035783 A1* | 2/2016 | Dixon .................. H01L 29/205 257/184 |
| 2017/0131389 A1* | 5/2017 | Na .................... H01L 27/14609 |

\* cited by examiner

SHORT-WAVE INFRARED DETECTOR ARRAY AND METHOD FOR THE MANUFACTURING THEREOF

TECHNICAL FIELD

The invention relates to short-wave infrared (SWIR) detector arrays for detection and imaging comprising Complementary Metal Oxide Semiconductor (CMOS) circuits. More precisely the invention relates to the monolithic integration of a SWIR conversion layer and a CMOS readout circuit and to methods for realizing such SWIR detector arrays and to applications thereof.

STATE OF THE ART

A focal-plane array (FPA) consists of an array of light-sensing pixels—the detector array, attached to a readout circuit (ROIC)—and operates by detecting photons at particular wavelengths and then generating an electrical charge, voltage, or resistance in relation to the number of photons detected at each pixel. The ROIC converts the charge collected over time to a voltage through amplification. This charge, voltage, or resistance is measured, digitized, and commonly used to construct an image of the object, scene, or phenomenon that emitted the photons. FPAs can also be used for non-imaging purposes such as wave-front sensing.

The difficulty in constructing high-quality, high-resolution FPAs derives mainly from the materials used.

The today market-dominating detectors operating in the short-wave infrared (SWIR)—defined as the wavelength range between 1.0 to 3.0 µm (from the cut-off of Si to that of the mid-wave infrared atmospheric window)—rely upon III-V materials (In, Ga, Sb and As) that have the advantage of high absorption efficiency, high carrier drift velocity and mature design.

Indium Gallium Arsenide (InGaAs) is the preferred material used in infrared spectroscopy for studying light in the wavelength range of 0.9 to 1.6 µm. InGaAs detectors are usually cooled thermoelectrically or cryogenically to extend their spectral range or allow for long exposure data acquisition. Photoluminescence, Raman spectroscopy, laser diode characterization, and fluorescence are among the most common infrared spectroscopy applications that require a high sensitivity detector with low noise in the SWIR.

Typically, InGaAs arrays are planar structures with p-i-n (positive-intrinsic-negative) or p-n (positive-negative) photodetector arrays that are monolithic in nature. The detector array has a high bandgap semiconductor (e.g., InP, $InAs_yP_{1-y}$, $In_xAl_{1-x}As_yP_{1-y}$, etc.) above the $In_xGa_{1-x}As$ to minimize dark current and surface recombination from electron hole pairs that form in the detector material. The pixel is built by diffusing or implanting a p-type dopant like Zn, C, or Be into the structure at certain specific points down to the $In_xGa_{1-x}As$ layer to make the pixel which is a p-i-n or the p-n detector as opposed to doping the entire layer and etching away material to form a mesa structure. An ohmic contact or near ohmic contact is made on top of the diffused area to allow the pixel to be biased and connected to a circuit to remove the charge collected (both dark charge as well as charge from photons that are converted to electron hole pairs). A second contact is made (cathode contact) elsewhere to the n-side material or the substrate, typically InP or $InAs_yP_{1-y}$, to allow the circuit to be completed.

HgCdTe is the only common material that can detect in both SWIR atmospheric windows of 1.5 to 1.8 µm and 2.2 to 2.4 µm. Military technology has depended on HgCdTe for night vision. In particular, the US air force makes extensive use of HgCdTe on all aircraft, and to equip airborne bombs. A variety of heat-seeking missiles are also equipped with HgCdTe detectors. HgCdTe detector arrays can also be found at most major research telescopes including several satellites. To raise their sensitivity, they are usually cooled to liquid nitrogen temperature.

In current FPAs, all these materials cannot be used to construct the electronics needed to transport the resulting charge, voltage, or resistance of each pixel to the measurement circuitry. Therefore, this set of functions is typically fabricated in silicon using standard CMOS processes. The detector array is then hybridized or bonded to the ROIC, typically using indium bump-bonding, such as schematically illustrated in FIG. 1 [Ref. 21]. Different hybridization techniques—direct and indirect—as well as monolithic FPAs with integrated detector and readout functions were successively developed. Another approach known as the "Z-technology" provides extended signal processing real estate for each pixel by extending the structure in the orthogonal direction. Stacked and thinned readout chips are glued together, and the detector array is connected to the edge of this signal processing stack with indium. Alternatively, in a "loophole" approach detector elements are connected to the underlying readout through vias (to allow the charge collection), which are etched through the detector material to contact pads on the readout part (see http://www.xenics.com/en/infrared-detector-types). Finally, the constraints given by the currently used materials result in complicated hybridization techniques resulting in low fill factor and small overall detection size.

When it comes to selecting a SWIR detector on today market place, there are four main characteristics that determine the performance of either InGaAs or HgCdTe hybridized on a CMOS ROIC: (1) dark current, determined mainly by bandgap, epitaxy material quality, processing of the diodes and ROIC design; (2) noise is an influential factor, determined by both photodiode quality and ROIC; (3) another is readout speed, which is determined by the ROIC layout, pixel clock speed and the number of outputs; and finally (4) sensitivity, which is determined by material quantum efficiency (QE) and ROIC amplifier gain.

Not all of these parameters can be optimized at the same time so that there are some physical trade-offs involved. State-of-the-art InGaAs outperforms HgCdTe in terms of dark current, noise and sensitivity. As with most infrared materials, InGaAs has to be fabricated on a substrate with the same lattice constant as the alloy itself. Lattice-matching InGaAs to an indium phosphate (InP) or GaAs substrate normally leads to a cut-off wavelength of 1.6 µm (the most common composition is $In_{0.53}Ga_{0.47}As$, lattice matched to InP), while HgCdTe can go up to 2.5 µm. The sensitivity of the InGaAs sensor can however be extended by varying the fraction of indium in the ternary compound that will also change the lattice constant of the material. But a higher lattice mismatch means also a smaller bandgap and more crystal structure defects, leading to more dark current and noise, with related higher cooling requirements.

Many techniques have been developed to improve InGaAs FPAs. For example, U.S. Pat. No. 6,573,581 describes intentionally doping the intrinsic region of a p-i-n photodiode to reduce the dark current in planar structures. U.S. Pat. No. 4,682,196 describes a structure for making high speed, low dark current devices. Known conventional techniques all require that the photodiode is directly connected to the amplification circuit. The documents U.S. Pat. Nos. 4,904,608 and 5,242,839 describe lowering the dark current of mesa detector devices. The documents U.S. Pat. Nos. 4,656,494 or 8,039,882 describe avalanche photodiodes, which have a buried detector layer to allow for multiplication of the charge to occur or for a guard ring to be created. The guard ring is to prevent the gain from spreading beyond the avalanche photodiode. The document U.S. Pat. No. 5,386,128 further describes a CCD and an InGaAs photodiode integrated into a single imaging device. The described device moves charge from the photodiode to the integrated amplification circuit. This device specifically requires the photodiode to be directly connected to the amplification circuit and does not use a buried photodiode to reduce the dark current. Pinned photodiodes are also conventionally used in most modern CMOS imagers. For example, U.S. Pat. No. 6,297,070 discloses a low noise silicon photodiode that also allows charge transfer enabling correlated double sampling in the pixel to lower noise.

Other materials for use in the SWIR spectrum were investigated recently. As Si is not suitable and because of the high optical absorption of Ge and its compatibility with Si processes, a Ge layer deposition on the top of Si layer has been investigated. Despite the large lattice mismatch (~4%) between Si and Ge, high-quality Ge thin layer could be achieved with improved fabrication processes, e.g., low-temperature bonding [Ref. 4], rapid melt growth (RMG) [Ref. 1] and low temperature epitaxial growth [Ref. 23]. Photodetectors with high performance using Ge-on-Si have also been demonstrated in recent years [Ref. 23, Ref. 14, Ref. 41, Ref. 22]. Among these photodetectors, the avalanche photodiode (APD) emerges as an excellent choice for many applications because of its internal gain and improved sensitivity [Ref. 23]. As Si shows a very low k-value (i.e., the ionization ratio of electrons and holes), highly desirable for APDs to achieve high gain-bandwidth as well as low noise [Ref. 19], Ge-on-Si systems were investigated for developing APDs. CMOS-compatible Ge/Si separate absorption-charge-multiplication SACM APDs could even be demonstrated [Ref. 23, Ref. 45, Ref. 10]. However, Ge APDs using charge amplification close to avalanche breakdown are commonly considered to intrinsically suffer from an intolerably high amplification noise.

More recently, GeSn photoconductors on Si were developed and characterized [Ref. 8, Ref. 9, Ref. 29, Ref. 11, Ref. 34]. As the incorporation of Sn reduces the difference between the indirect and direct bandgap in Ge, the pseudo-direct and tunable bandgap of $Ge_{1-x}Sn_x$, along with its CMOS compatibility have furthered the development of this material system that is seen as an attractive solution for direct incorporation of FPAs with SWIR detection. Some studies suggest a relaxed $Ge_{1-x}Sn_x$ room temperature direct bandgap requires only 8-9% Sn [Ref. 5, Ref. 18, Ref. 17] whereas the first demonstration of lasing using a direct bandgap $Ge_{0.874}Sn_{0.126}$ grown on Si could be reported lately [Ref. 44]. Further advancement of $Ge_{1-x}Sn_x$ technology has led to photodetectors that have already shown an extended long wavelength spectral response [Ref. 35, Ref. 25] and an increased responsivity compared to Ge [Ref. 39, Ref. 32]. Enhanced long wavelength spectral response out to 2.6 μm was even demonstrated for a photoconductor with 10% Sn at room temperature [Ref. 34]. It means the operation range of GeSn-based optoelectronic devices can potentially cover all the SWIR wavelengths desirable for Si photonic applications without the need for a cryogenic cooling system. High speed operation of $Ge_{1-x}Sn_x$ based detectors has also been demonstrated up to 40 GHz opening up the possibility for high speed optical communication [Ref. 32]. In addition, due to the tunable lattice constant and formation of Lomer dislocations, $Ge_{1-x}Sn_x$ has been shown to work as universal compliant buffer layer to grow high quality lattice mismatched materials, like III-Vs, on Si [Ref. 2, Ref. 30]. However, compared to the photodiodes based on Ge or III-V materials, $Ge_{1-x}Sn_x$ photodiode may still suffer from a much larger dark current, which increase the power consumption and degrade the signal-to-noise-ratio (SNR). In recent studies, the temperature dependent characteristics and noise mechanisms specific to this material system have been investigated [Ref. 8-9] and provide the baseline for a cost effective $Ge_{1-x}Sn_x$ FPA integrated on Si for detection in the SWIR spectrum. A surface passivation technique could further be used to suppress the dark current originating from the mesa sidewall of a $Ge_{1-x}Sn_x$ on Si p-i-n photodiode [Ref. 12]. It has been demonstrated elsewhere that the dark current can be reduced either using Si or yttrium-doped $GeO_2$ [Ref. 11, Ref. 27] as passivation layer. A decrease in the device dark current via a thicker GeSn layer may also be achieved that would enhance the absorption in the SWIR [Ref. 34]. Finally, owing to the tremendous effort made to develop material growth, including chemical vapor deposition (CVD) and rapid melting growth (RMG), device-level material quality of GeSn could be demonstrated [Ref. 30]. Furthermore, an uncooled GeSn detector FPA could be achieved recently [Ref. 6].

A variety of challenges exists for the growth of GeSn on Si such as large lattice mismatch between substrate and alloys (more than 4.2%), low solubility of Sn in Ge and instability of diamond lattice Sn above 13° C. In addition to these constraints, the commercial availability of deposition gases precursors has to be taken into consideration. The same applies to the equipment—including their performance in terms of operational lead time and reliability. Out of a summary of reports on $Ge_{1-x}Sn_x$ growth processes using CVD methods by different research groups [Ref. 34], one approach only relies on free available gas precursors—$GeH_4$ and $SnCl_4$—and a commercial reduced pressure (RP)-CVD reactor type [Ref. 28]. A Ge buffer is deposited between the Si substrate and the $Ge_{1-x}Sn_x$ layer in order to compensate the lattice mismatch between the layers. In another approach, the direct growth of $Ge_{1-x}Sn_x$ films on Si using a cold-wall ultra-high vacuum (UHV) CVD system operates with the same gas precursors, but doesn't require a Ge buffer layer [Ref. 29]. The alloy structure is grown strain-relaxed enabling this material to be a universal compliant buffer.

Current CVD however show some drawbacks that limit their commercial use. Firstly, they can only achieve a low rate of rate of deposition and a thin absorption structure. By UHV-CVD, the growth rate—reliable and efficient enough for industrial use—is extremely low, i.e. for Si in the order of 3 Å/min at 550° C. (U.S. Pat. No. 6.454.855 B1). Secondly, defects at the growth interface lead to dark conductivity of the structure. It means threading dislocations, layer cracking and wafer bowing—due to lattice and thermally mismatched layers—limit materials choice, detector size and layer thickness (WO 2011/135432 A1). However, recent growth studies of GeSn and SiGeSn alloys on 200 mm Si(100) and Ge virtual substrates performed in a cold-wall reduced-pressure chemical vapor deposition (RP-CVD) tool at Peter Grünberg Institute 9 in Jülich [Ref. 44] demonstrate the feasibility of achieving relatively large thicknesses for efficient optical mode confinement. It means up to 1 μm thick GeSn layers with Sn contents up to 14% were grown on thick relaxed Ge buffers, using $Ge_2H_6$ and $SnCl_4$ precursors and a strong strain relaxation (up to 81%) at 12.5% Sn concentration could be obtained without crystalline structure degradation [Ref. 42].

In a comprehensive list of Ge epitaxy methods [Ref. 43], a new procedure based on low energy plasma-enhanced CVD (LEPECVD) emerges [Ref. 33] allowing for low threading dislocation density under low thermal budget and much higher deposition rates in comparison with the UHV-CVD method. By PECVD with DC discharge, growth rates of at least 150 Å/min or even 600 Å/min may be achieved. Using this procedure, a near-infrared imager sensor with monolithically integrated Ge photodiodes has been demonstrated that has sufficiently low dark current for camera operation with moderate Peltier cooling [Ref. 24]. A sufficient thickness of the Ge crystal rods could be achieved [Ref. 13] which can be considered as a scientific breakthrough as normally the strain introduced by growing a single crystalline layer of one material on a second crystal differing in lattice parameter can persist only up to a certain critical thickness. However, as previously mentioned, substantially pure Ge is considered to intrinsically suffer from an intolerably high amplification noise. Furthermore, pure Ge has a cut-off wavelength of 1.6 μm, limiting its potential field of applications in the SWIR.

SUMMARY OF THE INVENTION

It is the aim of this invention to provide a short-wave infrared (SWIR) focal plane array (FPA) with improved performance in comparison with infrared detector arrays of prior art. This SWIR detector array comprises a monolithic avalanche photodiode layer stack structure which has a small size and a small weight. Furthermore the detector array of the invention has a large sensitivity and comprises a large area FPA allowing covering efficiently the whole SWIR spectrum at room-temperature or eventually Peltier-cooled operation. The large area FPA provided by the invention are furthermore advantageous over tiling multiple smaller FPAs and result for example in a substantially complete surface coverage, compared to FPAs of prior art which have gaps between the tiled arrays.

More precisely the SWIR FPA of the invention comprises a SWIR conversion layer having a free surface forming an incident light surface of the detector array. The SWIR detector array comprises also a doped readout wafer being either a p-doped or n-doped. The readout wafer comprises:
- an array of charge collecting areas being either p-doped or n-doped charge collecting areas;
- a readout layer comprising an electrical circuit and defining a detector lower surface opposite the incident light surface, said SWIR detector array being configured to detect electromagnetic waves having a wavelength comprised between 1.0 μm and 3.0 μm.

The SWIR detector array further comprises a support layer to its incident light side, said support layer comprising silicon and being either p-doped or n-doped, the doping of said support layer being different with respect to the doping of said doped readout wafer.

The SWIR detector array further comprises an intermediate layer comprising a p-n junction and a bonding interface 1c-1d, said intermediate layer being arranged in between said support layer and said readout wafer.

The SWIR light conversion layer has a $Ge_{1-x}Sn_x$ alloy composition and comprises, to the side away from said intermediate layer a doped contact layer having a similar doping as said support layer, said doped contact layer being covered by an electrical contact layer.

In an embodiment the layer stack comprises said intermediate layer, a strain-relaxed Ge buffer layer, a $Ge_{1-x}Sn_x$ alloy SWIR conversion layer and a doped Ge contact layer deposited on said SWIR conversion layer as described further under the fabrication steps b2'-b4'.

In an embodiment said p-n junction is situated to the side of said support layer.

In an embodiment said p-n junction is situated to the side of said readout layer.

In an embodiment said p-n junction comprises said bonding interface and having a first portion situated to the side of said support layer and a second portion situated to the side of said readout layer.

In an embodiment said readout electrical circuit is a CMOS type circuit processed in said readout layer so as to be accessible in said detector lower surface.

In an embodiment said light conversion layer has a thickness t1, defined in a direction perpendicular to said support layer of more than 350 nm, preferably more than 1 μm, still preferably more than 10 μm.

In an embodiment said support layer is a patterned layer and comprises trenches and elevated regions to its incident light side.

In an embodiment said SWIR light conversion layer is internally structured and comprises rods extending between said support layer and said doped contact layer. An advantage of said rods grown on a lattice and thermally mismatched substrates is that it reduces threading dislocation effects and so enhances the charge collection efficiency of the detector.

In an embodiment said rods have, defined in any cross section perpendicular to their length L, a <100> crystallographic orientation.

In an embodiment a greatest width of said rods, taken in any said cross section, is comprised between 1 μm and 7 μm.

In an embodiment said contact layer is a patterned contact layer.

In an embodiment the conversion efficiency is higher than 30%, preferably higher than 60%.

In an embodiment said absorption layer is realized by a LEPECVD technique.

In an embodiment to the incident light side, an optical layer is adapted to the incident light side of said rods to direct incident light into said rods.

In an embodiment said optical layer comprises an array of refractive microlens, or an array of diffractive microlenses, or an array of aspheric shaped microlenses, or an array of microprisms or an array of plasmonic planar metalenses allowing for multi/hyper-spectral imaging and analysis.

The invention is also achieved by a method of fabrication of a SWIR FPA and comprises the steps of:
- a) Fabrication of a readout wafer comprising the steps (a1-a7) of:
  - a1) providing a first silicon wafer being a low doped p or n type SOI wafer comprising a readout layer;
  - a2) forming a readout circuit in said readout layer by a Complementary Metal Oxide Semiconductor (CMOS) process;
  - a3) realizing charge collecting areas in said readout layer, said charge collecting areas being n-doped or p-doped with the same doping kind as the SOI wafer;
  - a4) planarizing said first silicon wafer to the same side of readout layer;
  - a5) adapting a readout carrier layer to said silicon wafer to the side of said readout layer by low temperature oxide-to-oxide bonding;
  - a6) thinning said first silicon wafer by conventional grinding and plasma etching techniques;

a7) providing a smooth, clean and oxide-free bonding surface by chemical polishing and passivation, so as to provide said readout wafer.
b) Fabrication of an absorbing wafer comprising the steps (b1-b9) of:
  b1) providing a second silicon layer having either a p-type doping or n-type doping opposite to the doping of said charge collecting areas;
  b2) patterning and passivating the surface of said second silicon layer so as to form a support layer comprising trenches and elevated regions;
  b3) depositing, by a LEPECVD process, a SWIR conversion layer made of an $Ge_{1-x}Sn_x$ alloy composition with a Sn content x between $0.04 \le x \le 0.15$ and so that during the deposition process rods are formed having a composition of $Ge_{1-x}Sn_x$, said rods having a basis situated on said elevated regions and having a length L being at least a portion of the thickness t1 of said SWIR light conversion layer, said rods having a top surface opposite to said bottom surface;
  b4) passivating the surface of the rods and filling the gaps between said rods;
  b5) planarizing the upper surface of the rods;
  b6) providing by low temperature oxide bonding an absorber carrier wafer on top of the planarized upper surface;
  b7) thinning, to a predetermined thickness t2, the formed stack comprising the patterned support layer and said SWIR light conversion layer so as to form said absorber wafer;
  b8) providing to said absorber wafer, a smooth, clean and oxide-free bonding surface to the side opposite of said upper surface by conventional surface techniques such as chemical mechanical polishing and wet chemical cleaning.
c) covalently bonding both surfaces so as to form a bonding interface and so that the SWIR detector array comprises an absorber wafer bonded to said readout wafer, forming a monolithic detector array unit;
d) annealing the monolithic detector array unit to realize hydrogen diffusion across the bonding interface, the annealing being performed by annealing temperatures lower than 350° C.;
e) removing the absorber carrier wafer by conventional etching techniques;
f) depositing on said SWIR light conversion layer, to the side away from said readout wafer I a doped layer having a doping of the type of said support layer;
g) forming electrical contacts on top of said doped layer;
h) removing the readout carrier by conventional etching techniques;
i) opening contacts to the readout electronics by photolithography and dry etching;
j) forming a patterned or non patterned electrical contact layer.

In an embodiment an optical incoupling layer is provided on top of said patterned electrical contact layer.

In another embodiment the fabrication steps (b1-b7) of the absorber are replaced by the following steps (b1'-b7'):
  b1') providing a second clean and oxide-free SOI substrate wafer having either a p-type doping or n-type doping opposite to the doping of said charge collecting areas;
  b2') depositing by a RP-CVD process a Ge buffer layer on said second silicon wafer;
  b3') depositing, by a RP-CVD process, a SWIR conversion layer made of an $Ge_{1-x}Sn_x$ alloy composition with a Sn content x between $0.04 \le x \le 0.15$;
  b4') forming a Ge contact layer by RP-CVD and doping;
  b5') providing by low temperature oxide bonding a carrier wafer on top of the planarized upper surface;
  b6') thinning, to a predetermined thickness t2, the formed stack comprising said patterned layer and said SWIR light conversion layer so as to form said absorber wafer;
  b7') providing to said absorber wafer, a smooth, clean and oxide-free bonding surface to the side opposite of said upper surface by conventional surface techniques such as chemical mechanical polishing and wet chemical cleaning.

In an embodiment the passivation of the bonding surface is performed by a low energy hydrogen implantation technique.

In an embodiment a doped layer is realized in said absorber wafer to the side of said bonding surface, said doped layer having the same doping-type as the charge collecting areas to provide a p-n junction within the SWIR absorber.

In an embodiment said SWIR light conversion layer, is doped to the side away from said support layer, so as to form a doped layer having a doping of the type of said support layer.

In an embodiment a doped layer is realized in said readout wafer, to the side away from said readout layer. This doped layer having an opposite doping-type as the charge collecting areas so as to provide a p-n junction within the CMOS wafer.

In an embodiment in step c) said covalent bonding is realized by a low temperature bonding technique, said low temperature being lower than 300° C.

The invention is also achieved by an optical system comprising said SWIR detector array and arranged to operate in a single-photon counting mode.

In an embodiment said SWIR detector array is part of a high sensitive LIDAR.

These and other objects of the invention are described in the drawings, specifications and claims.

BRIEF DESCRIPTION OF THE DRAWINGS

Further details of the invention will appear more clearly upon reading the following description in reference to the appended figures.

EMBODIMENTS OF THE INVENTION

Figure 1:
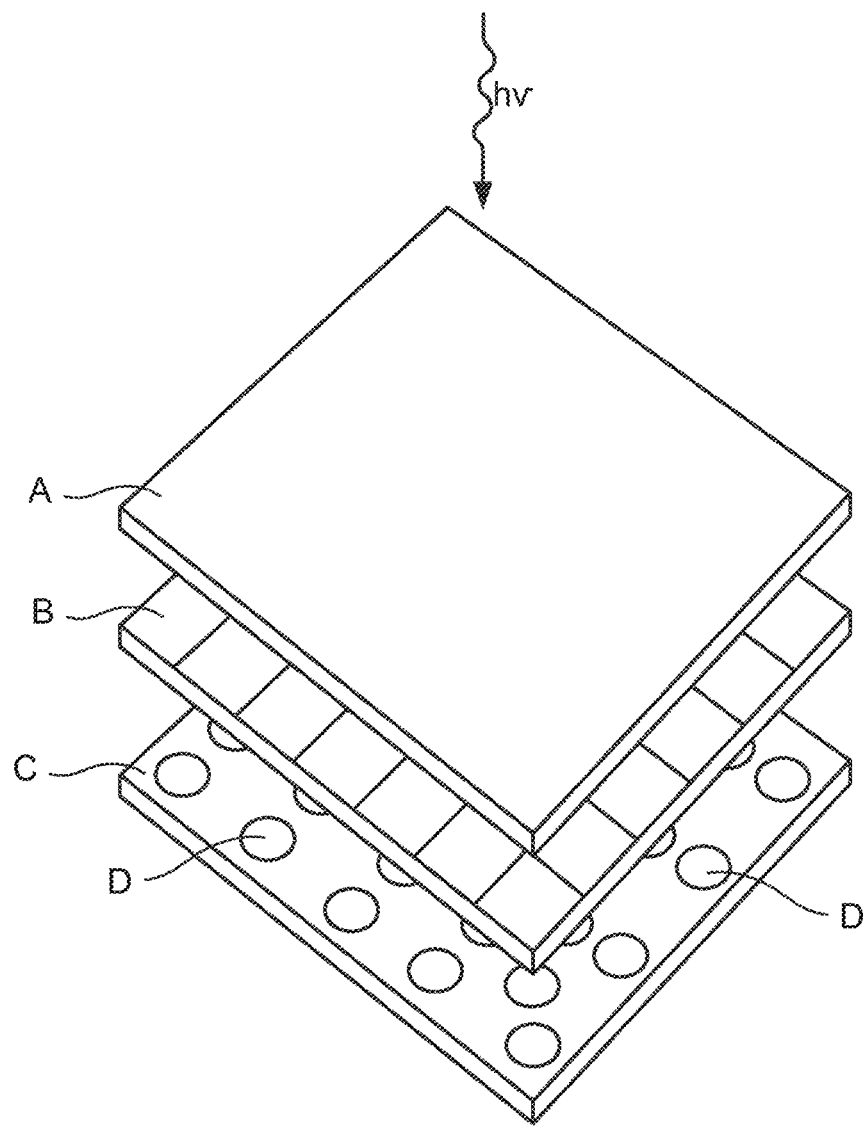
FIG. 1 illustrates a cross-section of a hybrid detector array of prior art having an absorber layer and a readout layer connected by bump-bonding.

FIG. 1 illustrates a SWIR detector array 1 of prior art. As described in the prior art such a detector array comprises typically a microlens array (A) and an absorber sheet typically made of InGaAs (B), as well as a readout circuit realized on a separate layer or wafer. The stack comprising the optical layer (A) and the absorber layer (B) is electrically and mechanically connected to the CMOS layer (C) by an array of bumps. The hybrid assembly of prior art infrared detector arrays, as illustrated in FIG. 1, requires a complex and delicate alignment process and does not allow to provide large, cheap, reliable and high efficient SWIR detector arrays.

Figure 2A:
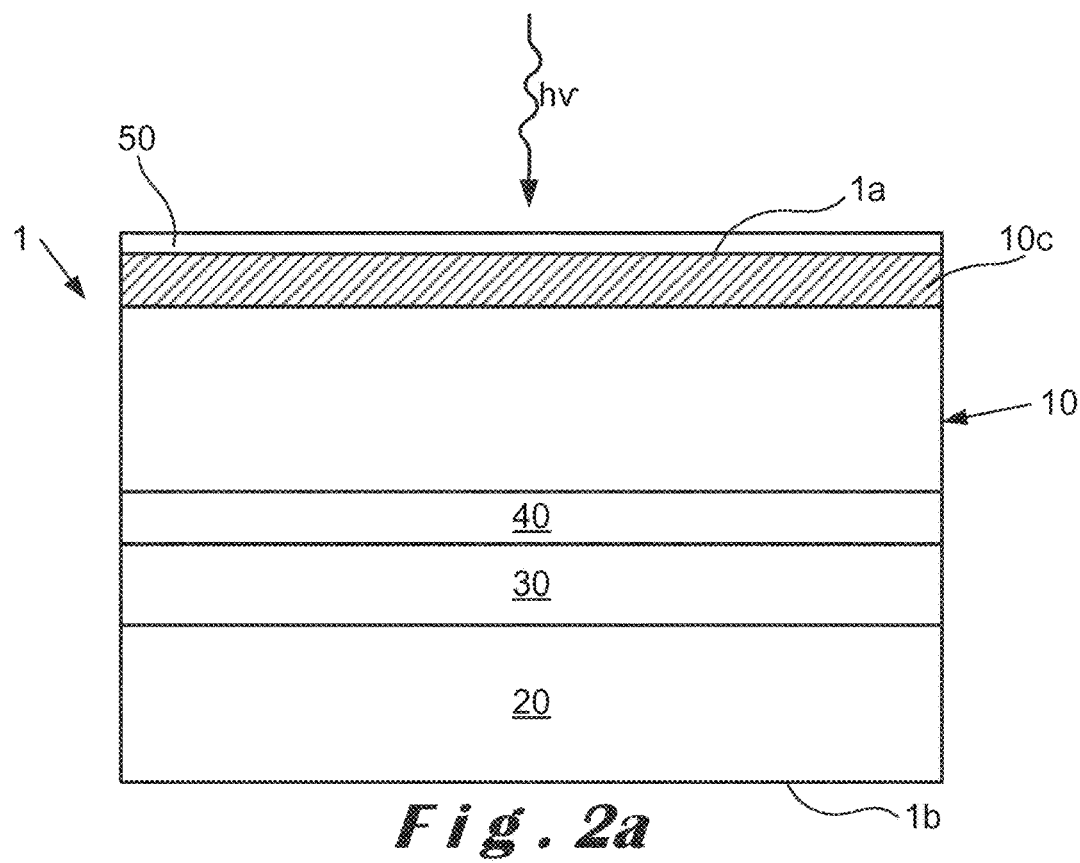
FIG. 2a illustrates a schematic cross-section of the SWIR photodiode structure of the invention.
Figure 2B:
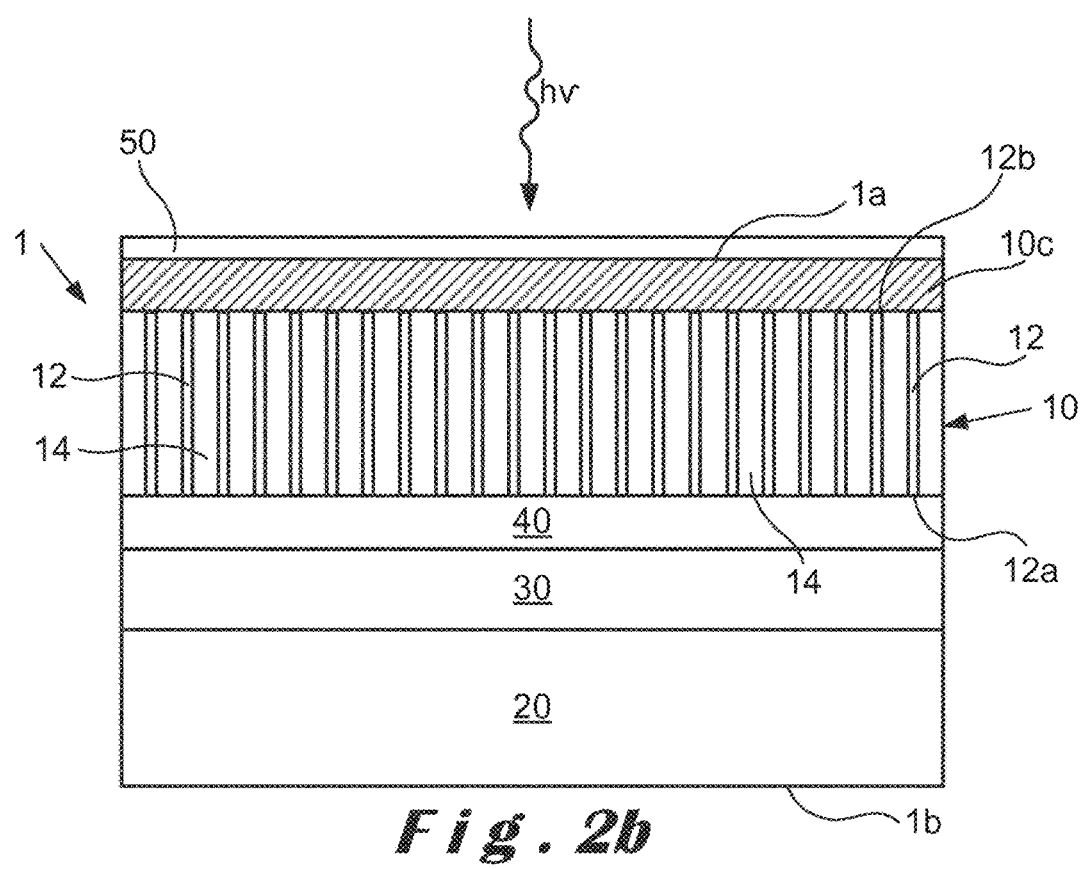
FIG. 2b illustrates a schematic cross-section of the SWIR photodiode structure wherein the SWIR absorption layer comprises an array of rods.

FIG. 2a and FIG. 2b illustrate two embodiments of the invention. It is understood that all FIGS. 2-8 only illustrate cross sections of a portion of the complete detector array 1. Compared to infrared detectors of prior art, the device of the invention provides a highly efficient monolithic SWIR detector array 1 comprising a simplified and wide layer stack structure having a small thickness, a reduced weight and lower power requirements. The SWIR detector array 1 of the invention is also called a focal plane array (FPA) hereafter. The device of the invention allows to provide very sensitive and large area monolithic FPAs able to cover efficiently the whole SWIR spectrum at room-temperature or eventually Peltier-cooled operation. Said SWIR spectrum is defined by a wavelengths range between 1.0 µm and 3.0 µm.

The FPA 1 of the invention is configured to detect electromagnetic waves having a wavelength comprised between 1.0 µm and 3.0 µm.

In an embodiment of the invention, illustrated in FIG. 2a, the SWIR detector array 1 comprises the following elements:

a) a doped contact layer 10c;
b) a SWIR conversion layer 10, also defined as absorption layer or light conversion layer, having a free surface forming an incident light surface 1a of the detector array 1, said conversion layer is arranged for converting short wavelength infrared photons in electron-hole pairs. The SWIR conversion layer 10 has a $Ge_{1-x}Sn_x$ alloy composition.
c) a support layer 40 comprising silicon and being either p-doped or n-doped, the doping of said support layer 40 being the same as said doped contact layer 10c and opposite to the doping of the electric charge collectors in the CMOS readout layer 20;
d) an intermediary stack layer 30 comprising a p-n junction and a bonded interface 1c-1d between the SWIR absorber wafer and the readout wafer,
e) a readout wafer 20 comprising the COMS readout circuits 22, including electric charge collectors 24.

In an embodiment the layer stack comprises said intermediate layer, a strain-relaxed Ge buffer layer, a $Ge_{1-x}Sn_x$ alloy SWIR conversion layer and a doped Ge contact layer deposited on said SWIR conversion layer as described further in the fabrication steps b2'-b4'.

In another embodiment the FPA 1 of the invention, illustrated in FIG. 2b, the SWIR detector array 1 comprises the following elements:

a) a doped contact layer 10c;
b) a SWIR conversion layer 10, also defined as absorption layer or light conversion layer, having a free surface forming an incident light surface 1a of the detector array 1, said conversion layer is arranged for converting short wavelength infrared photons in electron-hole pairs; the SWIR conversion layer 10 has a $Ge_{1-x}Sn_x$ alloy composition and is, in this embodiment, internally structured such that it comprises rods 12 extending between said patterned layer 40 and said doped layer 10c having a similar doping as the patterned layer 40;
c) a support layer 40 being a patterned layer comprising trenches 42 and elevated regions 44 to its incident light side, said support layer 40 comprises silicon and is either p-doped or n-doped, the doping of said support layer 40 is the same as said doped contact layer 10c and opposite to the doping of the electric charge collectors in the CMOS readout layer 20;
d) an intermediary stack layer 30 comprising a p-n junction and a bonded interface 1c-1d between the SWIR absorber wafer and the readout wafer;
e) a readout wafer 20 comprising the COMS readout circuits 22, including electric charge collectors 24.

It is understood that in the embodiment of FIG. 2b wherein the SWIR conversion layer 10 comprises rods, the support layer 40 is a patterned layer and that in the case of the embodiment of FIG. 2a, the support layer 40 is a substantially smooth layer 40.

Figure 7A:
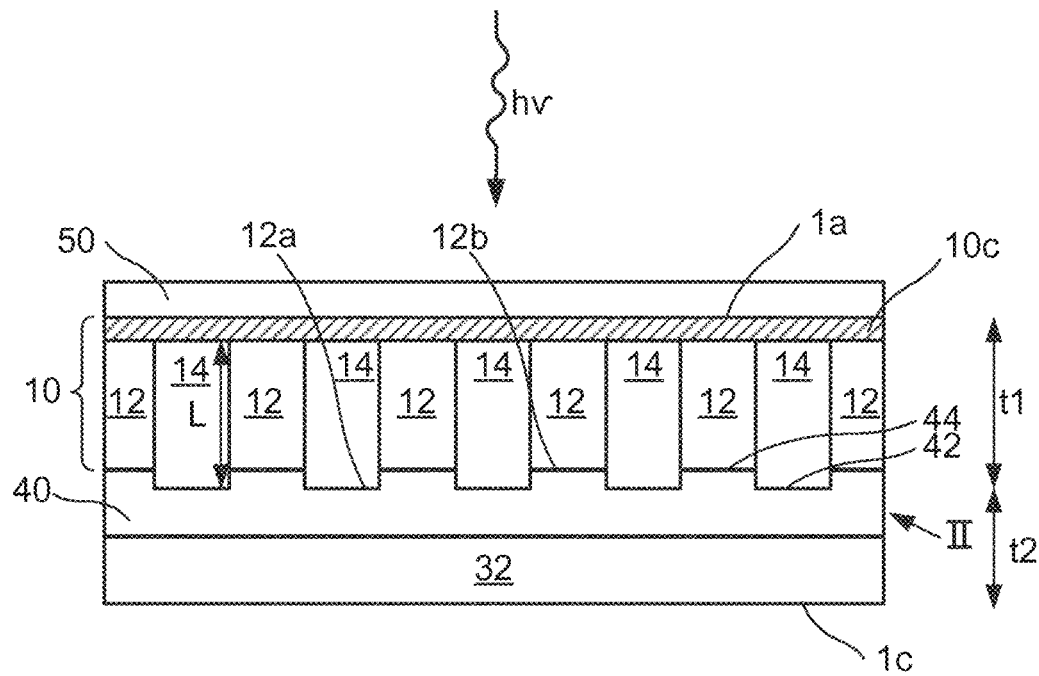
FIG. 7a illustrates a layer stack comprising a patterned layer, a SWIR conversion layer, a doped contact layer and a patterned electrical contact layer.
Figure 7B:
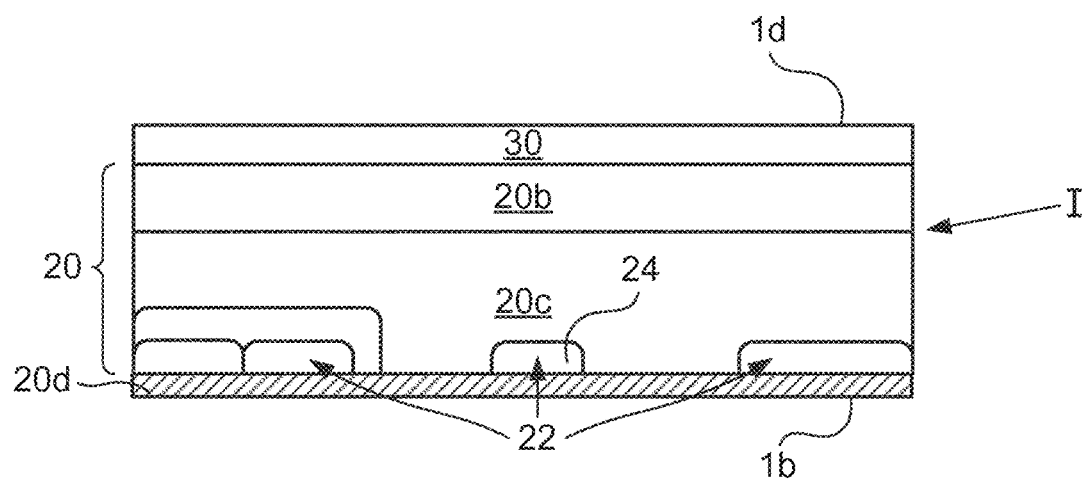
FIG. 7b illustrates a first silicon wafer comprising a readout layer comprising charge collectors and a readout electrical circuit.

It is also understood that said intermediate stack layer 30 may be arranged to the side of the absorber layer. In a variant a first intermediate stack layer 30 may be arranged to the side of said readout wafer 20 and a second intermediate stack layer 32 to the side of said absorber wafer as illustrated in the embodiment of FIG. 7a-b.

In all the embodiments of the invention said p-n junction may be situated to one of the sides of said bonded interface 1c-1d or may comprise a first portion to one side of said bonded interface 1c-1d and a second portion to the other side. Said bonded interface must not be necessarily in the middle of said p-n junction.

The stacked layer configuration comprising said SWIR conversion layer 10, said support layer 40, said intermediate stack 30, which is in electrical connection with said electric circuit 22 and the further described electrical contact layer 50, forms a SWIR avalanche photodetector array (APD) configuration. The array configuration of the detector 1 of the invention is formed by the electrical connection between the absorbing layer 10 and the array configuration of the electric charge collecting regions 24 as further described.

The rods 12 are grown by a low temperature epitaxial process, as described further, so that they have a well-defined crystallographic structure and present reduced defects, such as threading dislocations at the interface between the seed patterned layer 40 and the grown rods 12. Growing $Ge_{1-x}Sn_x$ alloy rods with an Sn content x between about 0.04≤x≤0.15 on a support layer 40 allows also providing a structured absorption layer 10 rather than a continuous film, which provides, besides the extension of the absorption edge to longer wavelength compared with Ge, a detector device with higher performance thanks to low threading dislocation defects between lattice mismatched materials, the lower thermal sensitivity, a less stringent demand on temperature stability compared with the conventional III-V based photodetectors [Ref. 11] and a large responsivity at low power over the whole SWIR wavelength range. Depending on the alloy composition and the targeted quantum efficiency, the absorber material thickness t1 may be as thin as 10.0 µm to 20.0 µm or even 0.5 µm to 10.0 µm. The absorption layer 10 is realized preferably by a LEP-ECVD technique as explained further.

Figure 3A:
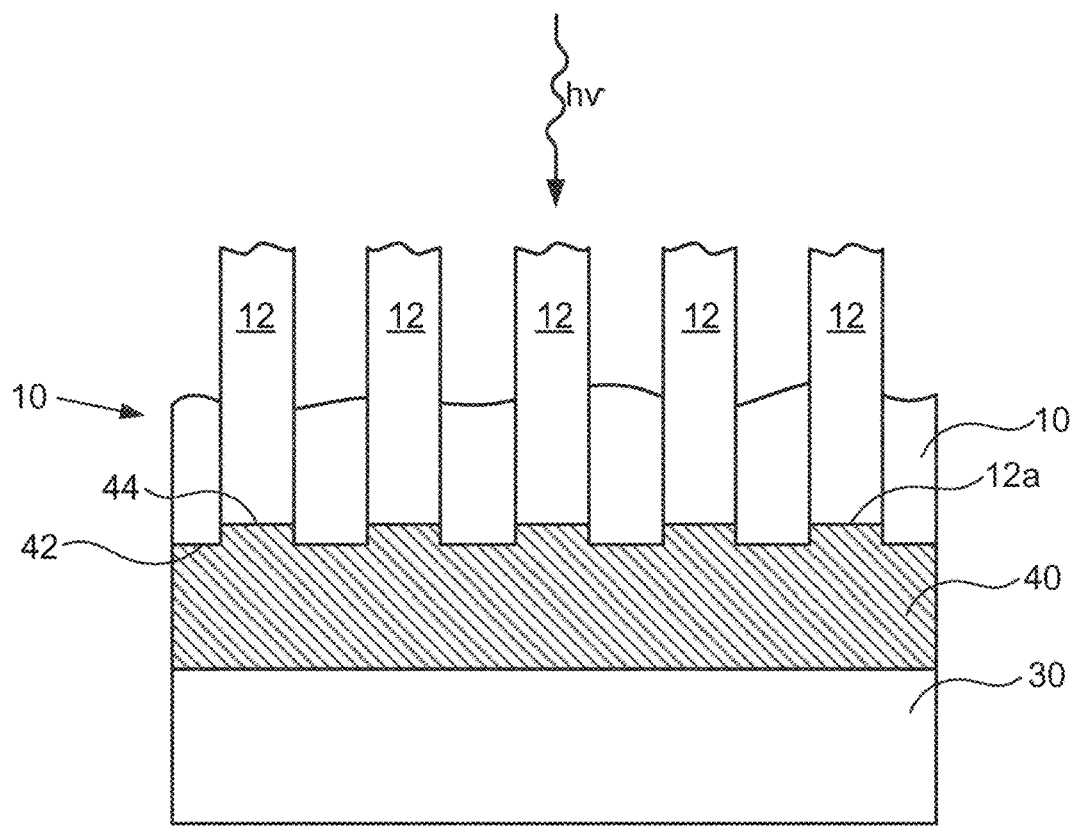
FIGS. 3a-b illustrates two different cross-sections of the SWIR absorber layer.
Figure 3B:
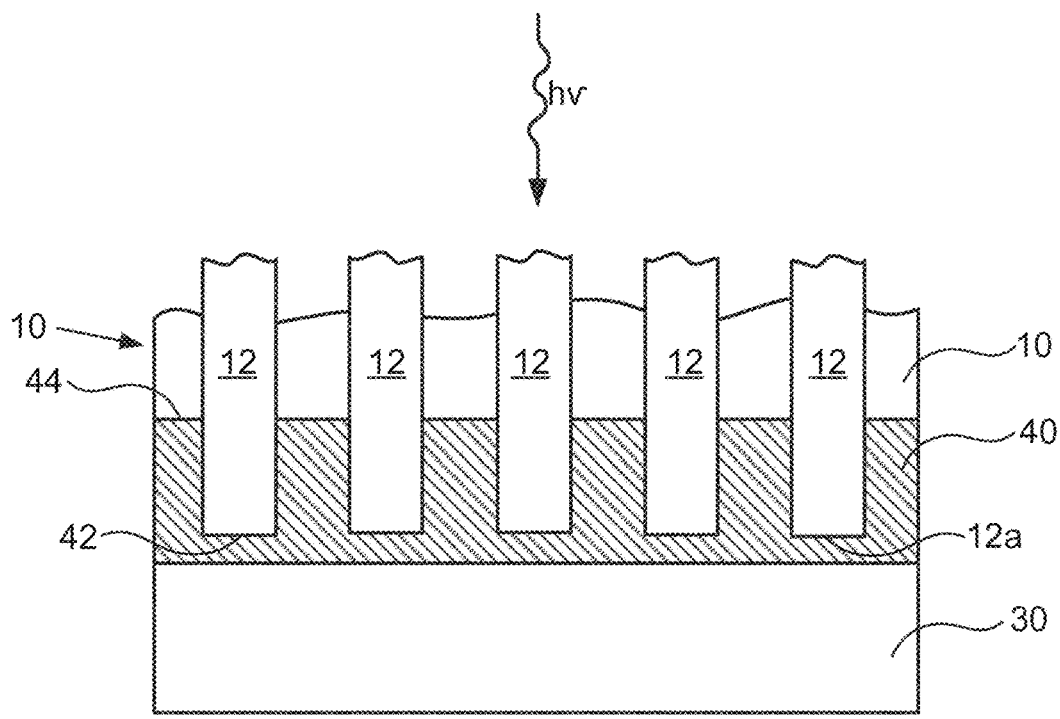

As illustrated in FIGS. 3a-b said rods 12 are preferably formed, as further described in the section related to the fabrication method, on said elevated regions 44 but may also be formed on said trenches 42. Said rods 12 define a rod basis 12a on the support layer 40 and an upper surface 12b opposite to said basis 12a. Said trenches 42 and/or said elevated regions 44 may comprise microstructures or additional layers to limit defects during the formation of said rods.

Figure 4:
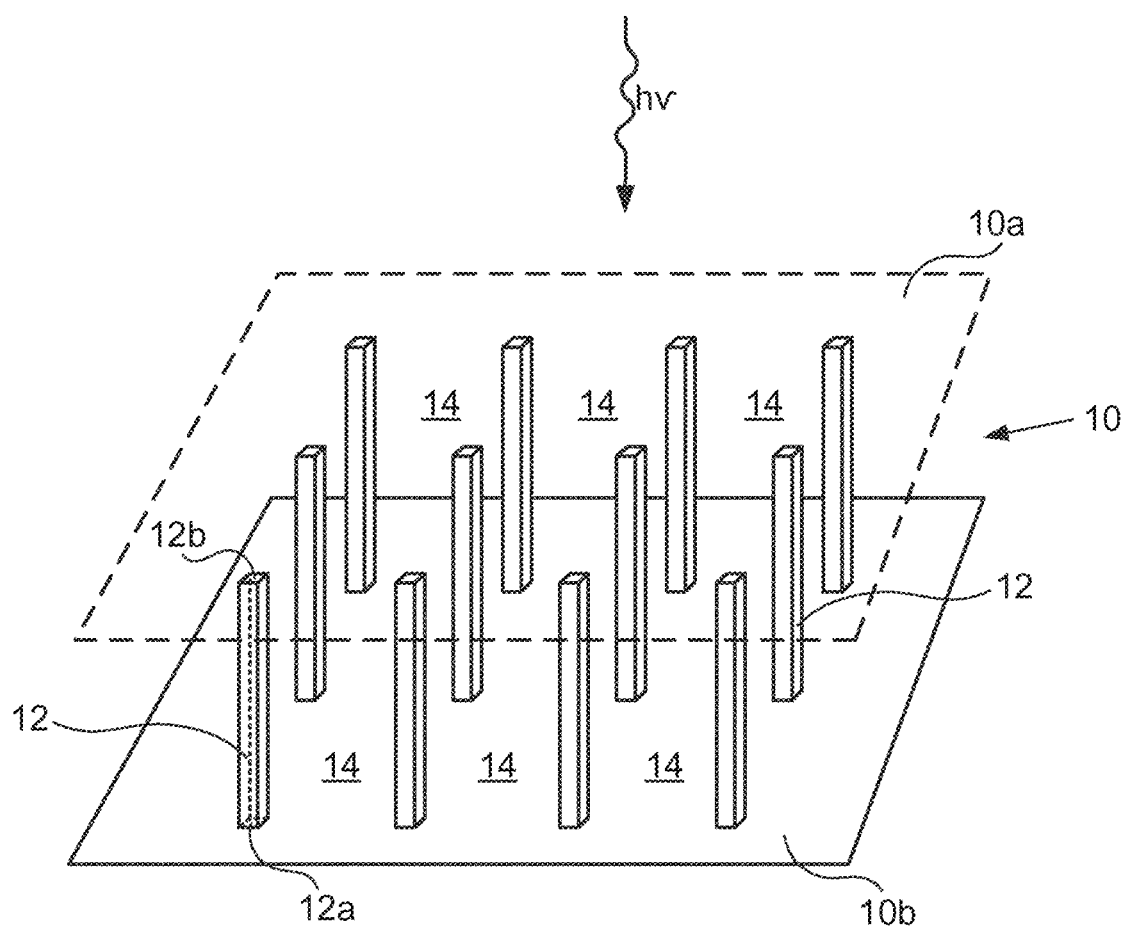
FIG. 4 illustrates a detailed structure in the SWIR conversion layer comprising rods separated by gaps.

Adjacent rods 12 are separated by gaps 14 as illustrated in FIG. 4. These gaps 14 may be filled with a passivation layer. This passivation layer may be a dielectric passivation layer and may be formed during or after the growth process of the rods 12.

Said gaps 14 may be filled with a material suitable to improve the confinement of infrared light into said rods 12, or may be suited to reduce the leakage of infrared light and/or electrical charges outside said rods 12. Said rods 12 may be arranged as an closely packed rod arrays, for example an array comprising substantially hexagonal shaped rods 12 that have at least one lateral face in contact with at least a portion of a face of a neighboring rod 12.

It is understood that the width of the gaps 14 between the rods 12 may be as small as allowed by the lithography and deep reactive ion etching techniques known in the art. For example the width of the gaps 14 may be lower than 1 µm, or below 500 nm or even below 100 nm.

A wide variety of packing densities and packing configurations are possible. For example, as illustrated in FIG. 6a-c each charge collecting area 24 of the readout wafer 20 may face a predetermined number of rods 12.

Figure 6A:
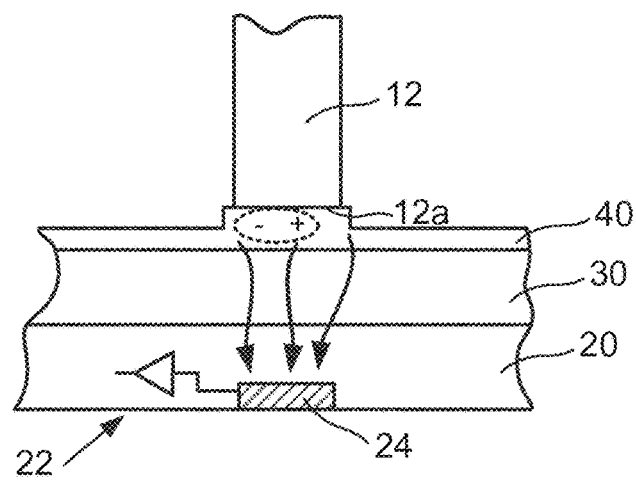
FIGS. 6a-c illustrates different alignment configurations of rods relative to a charge collection area of a readout layer.

In a variant, illustrated in FIG. 6a a single rod 12 has its basis 12a facing a single charge collecting area 24. As illustrated in the variants of FIG. 6b and FIG. 6c a bundle of rods 12 may face a single charge collecting area 24. Preferably said rods 12 have an orientation perpendicular to the plane of said support layer 40, but they may have a predetermined angle relative to the support layer 40. The cross section of said rods 12 may have any shape and their shape may vary according to their position in the array of rods 12. For example the shape of a cross section of said rods 12, defined perpendicular to its length L, may be substantially hexagonal, rectangular, or circular.

Figure 6B:
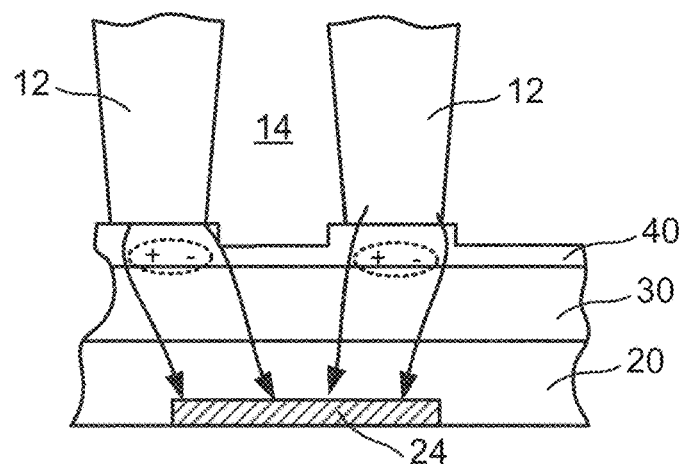
Figure 6C:
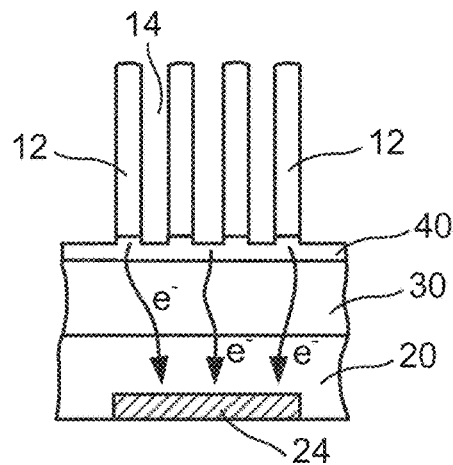

In a variant illustrated in FIG. 6b the rods 12 may have a conical shape. The conical shape may be so that its largest cross section is situated at the upper surface 12a so as to enhance the internal angle of reflection on the side wall of the rods. It is also understood that the array of rods 12 may comprise different shaped rods 12 and may comprise a portion of rods 12 that have a different chemical composition. In some applications of the device the central portion of the array of rods, defined in the plane of said array of rods 12, may have a different chemical composition than the rods 12 situated at the outside border portion of the array of rods 12.

It is understood that the packing density of the array of rods 12 may be different in different portions of said array of rods 12.

Said rod basis 12a may be equal to or may be smaller or greater than said upper surface 12a. A rod 12 may have for example a wide cylindrical portion to the side of said rod basis 12a and may have a thinner cylindrical portion to the side of said upper surface 12b. Also, the shape of the rods 12 may vary according to their position in the array of rods 12.

It is also understood that the chemical composition of at least a portion of the rods may vary from its basis 12a up to its upper surface 12b. For example, a first portion of a rod 12, to the side of its basis 12a, may have a higher Sn content than a second portion to said rod to its upper surface 12b. The rods may comprise, in its length, a step in the concentration of Sn. The Sn concentration may also be a continuous gradient along the length of the rods.

It is also understood that said rods 12 may have a radial index distribution, similar to graded index fiber optics. This radial index distribution may be realized by specific dopants and/or by a radial distribution of the Sn concentration.

It is understood that said rods 12 may comprise a variety of dopants. For example, a p-type layer may be formed by $BF_2^+$ ion implantation [Ref. 11]. Boron via $B_2H_6$ may also be a candidate of choice [Ref. 28]. For an n-type layer, phosphorous (via PH3) will be preferred.

Preferred sizes of said rods 12 are:
length: preferably between 1 µm and 20 µm;
largest cross section: preferably between 1 µm and 5 µm.

It is generally understood that the width of said trenches 42 and/or said elevated regions 44 are preferably chosen in accordance with the thermal mismatch in order to reduce at most the formation of thermal cracks during the bonding process or during a post-bonding anneal.

The rods 12 are configured to convert an incident photon into an electron-hole pair and have an infrared light guiding function at least to their incident light side. The array of rods 12 in the SWIR conversion layer 10 allows for improved properties compared to a light conversion layer that would be made of a continuous layer.

In an embodiment, illustrated in FIG. 7a, said doped layer 10c is covered by an electrical contact layer 50. In a variant said doped layer 10c may be formed by doping the incident light side of the photo-conversion layer 10. In a variant this doped layer is deposited to the incident light side of the photo-conversion layer 10.

Said electrical contact layer 50 is preferably a patterned electrical contact layer 50.

In a variant said doped layer 10c may comprise a patterned electrical contact layer. In a variant said doped layer 10c is said patterned electrical contact layer 50.

The patterned electrical contact layer 50 may be a patterned metal layer or a patterned conducting layer made of a non-metallic material such as ZnO. Said contact layer 50 may be any electrical conducting semiconductor layer 50 which is transparent to SWIR.

In an embodiment said intermediate silicon layer 30 comprises a p-n junction. In an embodiment said intermediate layer 30 comprises a slightly doped layer adjacent to the support layer 40 having the same doping type and another slightly doped layer of opposite type adjacent to silicon wafer 20. In a variant the absorber layer 10 may be a doped layer.

In a preferred embodiment said intermediate silicon layer 30 comprises the bonding interface 1c-1d and is situated between the SIWR absorber 10 and the readout wafer. This bonding interface 1c-1d may be at one or the other side of the layer, and in any place in-between. This bonding interface may be situated to one of both sides of p-n junction.

It is understood that in all embodiments of the invention the shape and/or the surface of said rods 12 may be configured so as to optimize the electrical field in the length and across of said rods. Also, said gaps 14 may comprise materials and/or structures which allow, in operation of the detector array 1, to confine the electrical field lines inside said rods 12.

Figure 5:
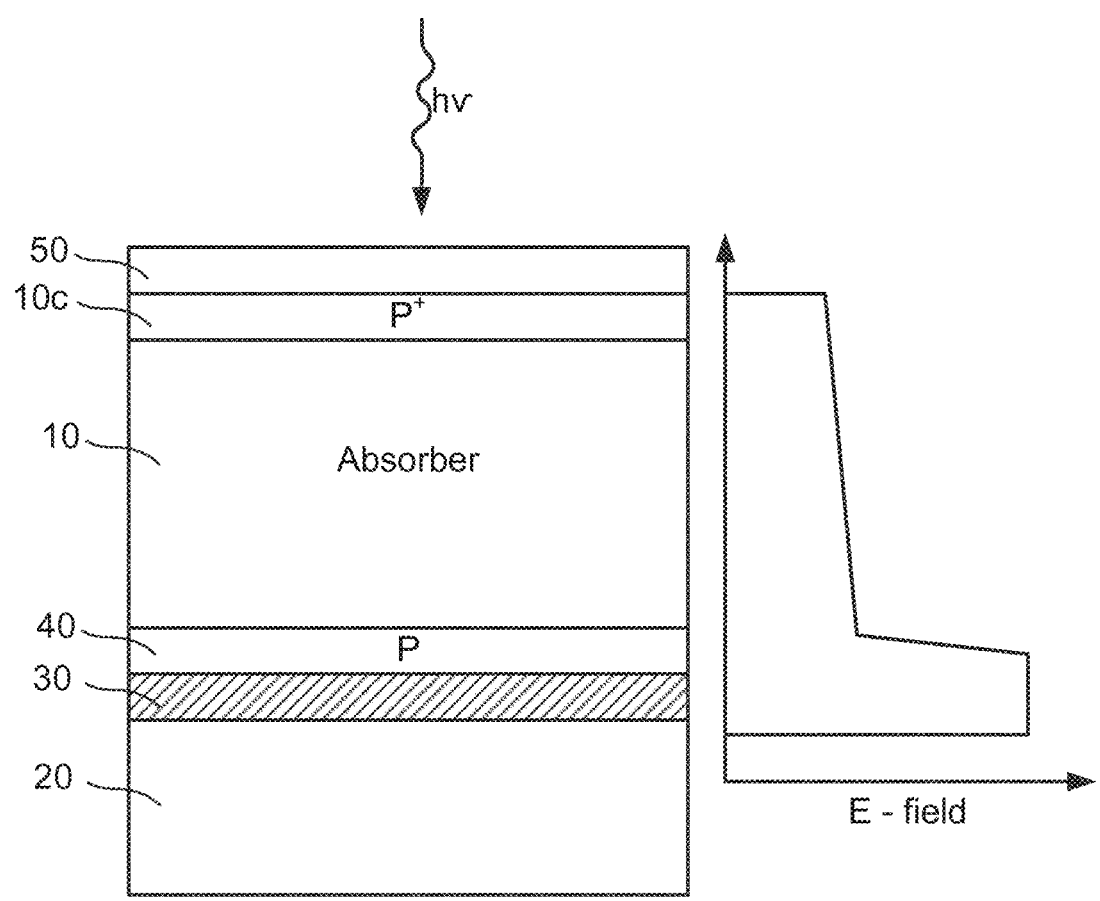
FIG. 5 illustrates a preferred embodiment of the invention comprising an avalanche layer stack configuration base on a $n^+$ layer, a p layer and a $p^+$ layer.

A preferred embodiment of the detector 1 of the invention is illustrated in FIG. 5. In the embodiment of FIG. 5 the silicon layer 20 comprises n+ charge collectors 24, whereas the support layer 40 is a p-doped layer and said doped layer 10c is a highly p-doped layer. In the preferred embodiment of FIG. 5 said absorption layer 10 is non-doped. In a variant of said preferred embodiment said absorption layer 10 may be a doped layer. As illustrated in FIG. 5 a photon incident on the absorption layer 10 creates an electron-hole pair in the absorber 10. The hole is collected at the incident light side and the electron, created by the absorption of a photon, drifts to the multiplier region situated to the side of said charge collectors of the p-n junction and is accelerated to sufficient energy to initiate a chain of impact ionization events, creating offspring electron-hole pairs and leading to internal gain. In the Geiger mode, in which single photon can initiate an avalanche that is self-sustaining, carrier generation predominates over extraction leading to exponential growth of the current. In this mode the detector array has to be electrically reset by reducing the bias to below breakdown long enough to terminate the avalanche, a process known as quenching.

In a variant the avalanche photodiode (APD) structure of the detector array 1 may comprise further layers such as buffer layers and/or charge layers. Depending on the desired electrical performances of the detector array 1 the layers of the APD structure of the detector 1 may be configured so as to shape a predetermined electrical field profile across the APD structure of the detector. Shaping electrical field profiles is well known in the field of designing APDs and are not further commented here.

The pixelated configuration of the SWIR detector array of the invention is described hereafter.

The SWIR detector array comprises two basic layers I and II, as illustrated in a preferred embodiment of FIGS. 7a-b, which show an example of a portion of the SWIR detector 1. A first layer, illustrated in FIG. 7b, defined as the absorption wafer II comprises at least one support layer 40 which may be a patterned layer 40, an absorption layer 10, a doped layer 10c and an electrical contact layer 50. By an etching technique, said absorption wafer II has a predetermined thickness t1+t2 and has a bonding surface 1c situated opposite said patterned electrical contact layer 50. Said predetermined thickness is preferably between 20 µm and 40 µm, more preferably between 10 µm and 20 µm.

Another wafer I, illustrated in FIG. 7b, comprises the readout wafer 20 which includes a diffusion layer 20b and a readout layer 20c. In an embodiment wherein the p-n junction should be situated within this readout wafer I, a layer of a different doping type 30 is realized adjacent to the diffusion layer 20b. The readout layer 20c comprises an electrical circuit 22 which comprises charge collecting areas 24 and a readout electronic circuit. This readout electronic circuit comprises transistors and doped areas such as p- or n-wells. Said charge collector areas 24 are preferably n implants or p implants. The distance between two charge collecting areas 24 defines the pitch of the detector array. Typical values of that pitch may range for example from 5 µm-10 µm or 10 µm-50 µm, depending on the CMOS process used.

Figure 8:
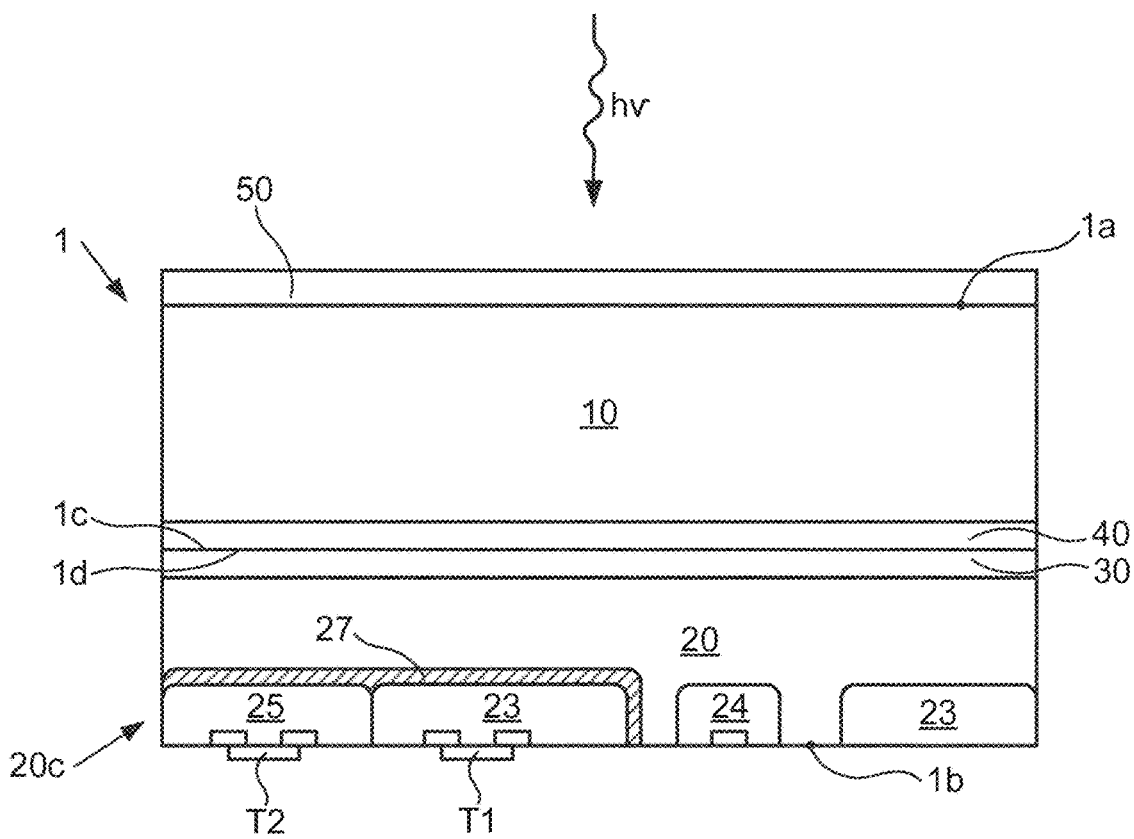
FIG. 8 illustrates an embodiment of the p-i-n diode structure of the SWIR FPA.

In a preferred embodiment, illustrated in FIG. 8 which shows only a portion of the detector 1, the charge collectors are n-implant regions 24. In the embodiment of FIG. 8 the p-side of the avalanche stack is tied to a negative bias voltage slightly less in magnitude than the breakdown voltage and the charges that are collected are electrons provided by electron-hole pairs which are generated by the incidence of photons on absorber layer 10 and which are separated by the n-p configuration in the intermediate layer 30 between the patterned layer 40 of the absorbing wafer II and the readout wafer I. The distance between said charge collecting areas 24 define the pixel size of the detector array 1. The pixel size that can also be defined by the distance between adjacent n-wells, may range for example from 5 µm-10 µm or 10 µm-50 µm, depending on the CMOS process used, allowing for a superior spatial resolution in comparison with devices of the prior art.

In order to allow for efficient charge collection, the readout wafer 20 should preferably be thin such that the space charge region, in operation of the device, extends mainly through said absorption layer 10. The thickness of said readout wafer 20 is preferably smaller than 100 µm, more preferably smaller than 50 µm, and more preferably below 40 µm.

The readout layer 20c in the preferred embodiment of FIG. 8 comprises pixel electronics such as n-MOS (T1) and p-MOS transistors (T2) that are respectively situated in p-wells 23 and n-wells 25. In such a case the readout layer 20c comprises preferably also deep p-wells 27 facing the transistor n-wells 25 to avoid that these n-wells 25 collect electrons in addition to the charge collecting n-wells 24.

Designing p and n well charge collectors 24 and deep n or p wells in CMOS charge collecting and readout electronic circuits and their processes, such as those using SOI wafers hosting such circuits, are well known to the person skilled in the art and are not further commented here.

In an embodiment said readout electrical circuit 22 is a CMOS type circuit processed in said readout layer 20c so as to be accessible in said detector lower surface 1b. In an embodiment the readout wafer 20 is preferably processed in an epitaxial thin Si layer and has a resistivity according to a low doping level in between about $10^{11}$ to $10^{13}$ cm$^{-3}$ of a first conduction type (for example n-conduction induced by n-doping), whereas the conduction type of the second layer II, also defined as absorption wafer II, should be opposite to that of the readout wafer I, for example p-conduction when the readout wafer I is n-doped. Depending on the alloy composition, the absorption layer 10 may be as thin as 10.0 µm to 20.0 µm or even 1.0 µm to 10.0 µm to provide a high quantum efficiency of the detector array 1.

Said second layer II is electrically and mechanically connected, by bonding, to said bonding surface 1d of said first layer I so as to form a monolithic detector structure which does not comprise any gaps or voids between the layers I and II. This is preferably achieved by a low temperature bonding technique as described in detail further in the fabrication method section.

Unlike the complex hybridization techniques of the infrared detectors of prior art, requiring transfer and bump bonding, the invention makes use of a low-temperature direct covalent wafer bonding method, whereby a CMOS processed readout electronics and a sensor wafer are combined in a detector structure forming a monolithic unit.

Efficient charge collection across the bonded interfaces is enabled by the following processing steps, further described in the fabrication process flow described in a separate section:

surface preparation techniques providing smooth, clean and oxide-freesurfaces;

low energy implantation of hydrogen in the range from 20 eV to 20 keV;

wafer bonding equipment including a He plasma source, and post-bonding anneal for the hydrogen diffusion towards the bonding interface.

It is generally understood that different embodiments of the absorber wafer II may be devised, such as variants to the embodiments of FIGS. 2a and 2b and that the realization of said readout wafer I and its bonding to said absorber wafer II may be adapted in function of the nature and the structure of said absorber wafer II.

The SWIR detector array 1 of the invention allows to obtain a high SWIR conversion efficiency, defined as the ratio of the number of electron-hole pairs generated to the number of incident photons in said absorber layer II. In an embodiment the conversion efficiency is higher than 30%, preferably higher than 60%.

The FPA 1 of the invention may have a large lateral dimension of about 10×10 cm$^2$ for one tile or even 50×50 cm$^2$ by stitching tiles—or any other juxtaposition technique.

It is understood that the detector array 1 of the invention may be configured in different electrical operational modes. More precisely by construction, the monolithic FPA of the invention may be designed in order to either time stamp photons or count them. It means that each photon arrival is digitally recorded by the activated pixel circuit. The monolithic FPA of the invention is therefore suitable also for energy discrimination, whereby the energy of photons incident on the sensor can be analyzed by the electronic circuit 22. Because digitization occurs within the pixels of the detector array, there is no need for analog circuitry in the readout path, and therefore this photon counting feature in the FPA of the invention eliminates readout noise. Thus, the single-photon counting highly sensitive SWIR FPA offers a reliable solution to avoid collisions of unmanned—aerial or terrestrial—vehicle.

The FPA of the invention comprising an array of single-photon avalanche diodes (SPAD) may further operate at room-temperature or eventually Peltier-cooled operation.

It is understood that the readout electronics of the detector 1 may be arranged to convert electrical signals into digital signals which can be stored and/or processed and that said digital signals may be further displayed as images on a computer screen.

Figure 9:
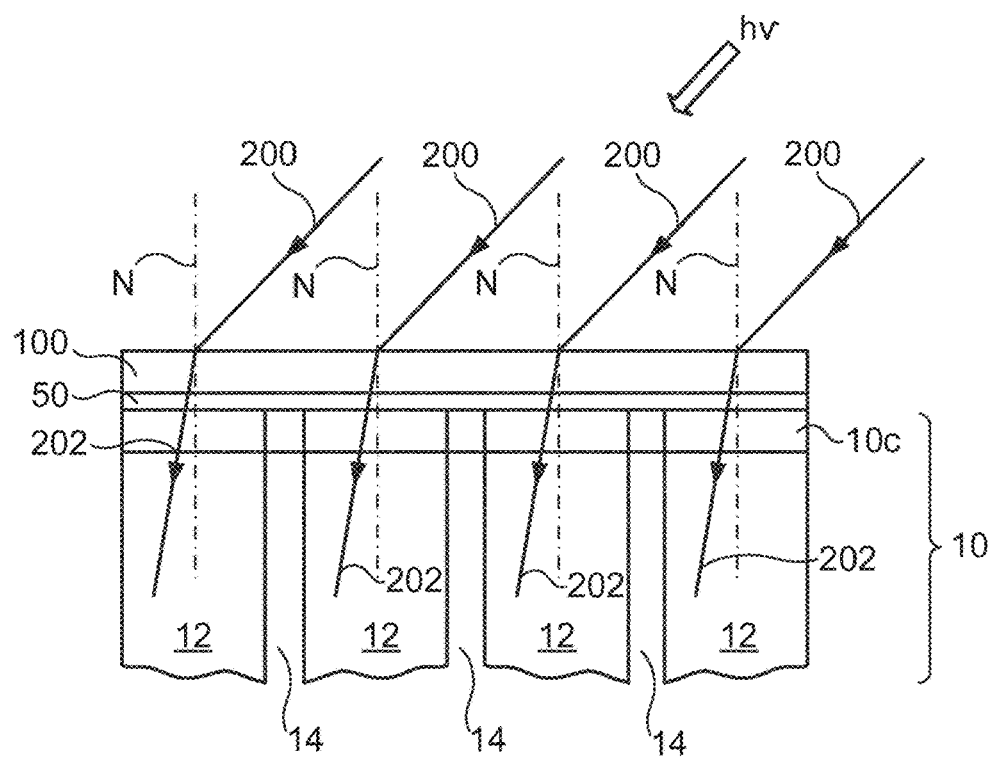
FIG. 9 illustrates an optical layer arranged to couple SWIR light into the rods of a SWIR light conversion layer.

Referring now to FIG. 9, an optical layer 100 may be adapted to the detector array 1 to deviate incident sideways radiation 200, so that the light incoupling of light rays 202 coupled inside the rods is improved, and so as to improve the light guiding efficiency of the rods 12, which enhances the light absorption of incident photons on said rods 12. Different variants of said optical layer 100 are possible. For example said optical layer 100 may comprise: refractive microlens, diffractive microlens array, aspheric shaped microlens arrays, microprism arrays. The optical layer may also comprise plasmonic planar metalenses allowing multi/hyper-spectral imaging and analysis. It is understood that said optical layer may comprise a stack of optical layers and may comprise optical shutters such as an array of electrostatically driven micro shutters, such as mems silicon micro shutters, which may be used to improve detection performances of optical systems in which the detector array 1 is implemented.

Referring now to the fabrication process flow, the key steps to manufacture the SWIR detector are described below.

The fabrication process comprises three main steps a), b), and c):

a) Realizing a readout wafer I;
b) Realizing an absorbing wafer II;
c) Bonding of the readout wafers I and the absorbing wafer II.

These three steps a), b), c) are described in detail hereafter:

a) Realizing a Readout Wafer (I)

In an embodiment the realization of the readout wafer I comprises the following steps (a1-a8):

a1) providing a first silicon wafer being a low doped SOI wafer comprising a readout layer 20c;

a2) forming, in said readout layer 20c a readout circuit 22 by a Complementary Metal Oxide Semiconductor (CMOS) process; the SOI wafer may be a high resistivity p or n type doped wafer;

a3) realizing charge collecting areas 24 in said readout layer 20c, said charge collecting areas 24 being n-doped or p-doped with the same doping kind as the SOI wafer;

a4) planarizing said first silicon wafer 20 to the side of the CMOS readout layer 20c by depositing oxide and chemical-mechanical polishing;

a5) adapting a first carrier layer, defined as readout carrier layer, to said silicon wafer 20 on side to the CMOS by low temperature oxide-to-oxide bonding;

a6) thinning said first silicon wafer 20 by conventional grinding and plasma etching techniques;

a7) providing a smooth, clean and oxide-free bonding surface 1d by chemical mechanical polishing and passivating the surface 1d by a low energy hydrogen implantation in the range of 20 eV to 20 keV, as known in the art for plasma cleaning of silicon wafers to diffuse to the bonded interface and passivate dangling bonds.

b) Realizing an Absorbing Wafer (II)

In an embodiment, the realization of the absorbing wafer II comprises the steps (b1-b8):

b1) providing a second SOI substrate wafer having either a p-type doping or n-type doping opposite to the doping of said charge collecting areas 24;

b2) patterning and passivating the surface of said second silicon wafer so as to form said support layer 40 comprising trenches 42 and elevated regions 44; the trenches—created by photolithography and dry reactive ion etching—as well as the width of the top surfaces may range between 2 and 6 μm. To reduce the lattice mismatch between GeSn and silicon, a thin undoped Ge buffer layer may optionally be deposited prior to the patterning;

b3) depositing, by a LEPECVD process a SWIR conversion layer 10; in order to get a sufficient thickness and a structure with low threading dislocation defects, said process able to process free available gas precursors such as GeH$_4$ and SnCl$_4$, on said support layer 40 a nominally undoped (intrinsic) but conducting or lightly doped SWIR conversion layer 10 made of an Ge$_{1-x}$Sn$_x$ alloy composition with a Sn content x between 0.04≤x≤0.15 and so that during the deposition process rods 12 are formed having a composition of Ge$_{1-x}$Sn$_x$, said rods 12 having a basis 12b situated on said elevated regions 44 and having a length L being at least a portion of the thickness t1 of said SWIR light conversion layer 10; depending on the alloy composition and the targeted quantum efficiency, the sensor material may be as thin as 10.0 to 20.0 μm or even 1.0 to 10.0 μm. In a preferred aspect of the embodiment the GeSn absorption layer is graded preferably linearly with a low grading rate of about 1% up to the maximum Sn content;

b4) passivating the surface of the rods 12 and filling the gaps 14 by using atomic layer deposition (ALD)—where the filling material may preferably be $SiO_2$, $Al_2O_3$—or yttrium-doped $GeO_2$ [Ref. 11, Ref. 27];

b5) planarizing the surface on top 1a of the rods 12 by oxide deposition and chemical-mechanical polishing;

b6) providing an absorber carrier wafer on top of planarized surface 1a by low temperature oxide bonding;

b7) thinning absorber wafer II up to thickness t2. The thinning is performed by grinding or plasma etching to a predetermined thickness of the so far formed stack comprising said patterned layer 40 and said SWIR light conversion layer 10. Once the stack is thinned it forms said absorber layer II which is further processed by the next step b8 so as to provide a bonding surface 1c;

b8) providing a smooth, clean and oxide-free bonding surface 1c situated opposite said patterned electrical contact layer 50 by conventional surface techniques such as chemical mechanical polishing and wet chemical cleaning.

In an embodiment the bonding surface 1c is passivated by a low energy hydrogen implantation in the range of 20 eV to 20 keV, as known in the art for plasma cleaning of silicon wafers to diffuse to the bonded interface and passivate dangling bonds.

In an embodiment a doped layer 32 is provided with the same doping-type as the charge collecting areas 24 to provide a p-n junction within the SWIR absorber II.

In an embodiment a doped layer 30 may be provided with the opposite doping-type as the charge collecting areas 24, so as to provide a p-n junction within the CMOS wafer I.

In another embodiment the fabrication steps (b1-b7) of the absorber (II) are replaced by the following steps (b1'-b7'):

b1') providing a second clean and oxide-free SOI substrate wafer having either a p-type doping or n-type doping opposite to the doping of said charge collecting areas;

b2') depositing in a 2-steps RP-CVD growth process—first step at low temperature and undoped, second step at high temperature and doped (i.e. $B_2H_6$ for p-type)—a strained-relaxed Ge buffer layer on said second silicon wafer followed by in-situ annealing;

b3) depositing, by a RP-CVD process, a SWIR conversion layer—unintentionally or slightly doped—made of an $Ge_{1-x}Sn_x$ alloy composition with a Sn content x between $0.04 \leq x \leq 0.15$;

b4') forming a Ge contact layer by RP-CVD and doping by ions implantation (i.e. $BF_2^+$) followed by rapid thermal annealing for activation;

b5') providing an absorber carrier wafer on top of said contact layer by low temperature oxide bonding;

b6') thinning, to a predetermined thickness t2, the formed stack comprising said SWIR light conversion layer so as to form said absorber wafer;

b7') providing to said absorber wafer, a smooth, clean and oxide-free bonding surface to the side opposite of said upper surface by conventional surface techniques such as chemical mechanical polishing and wet chemical cleaning.

c) Bonding of the Absorber Wafer (II) and the Readout Wafer (I)

In an embodiment, in the step c) the surface 1c is bonded to surface 1d with a wafer covalent bonding equipment—as manufactured for example by EV Group [Ref. 16], including a powerful helium plasma source to remove surface oxide—so that the SWIR detector array forms a monolithic detector array unit 1.

After having performed steps a), b), c) an annealing step d) is performed to realize hydrogen diffusion across the bonding interface, the annealing being performed by annealing temperatures lower than 350° C.

Additional steps are performed after the annealing step d):

e) removing the absorber carrier wafer by conventional etching technique such as grinding, plasma etching and chemical-mechanical polishing;

f) depositing on said SWIR light conversion layer 10, to the side away from said support layer 40, a doped layer 10c which has a doping of the type of said patterned layer 40; for example, a p-type contact layer may be formed by $BF_{2+}$ ion implantation [Ref. 11]; phosphorus (via $PH_3$) at $1 \times 10^{19}$ $cm^{-3}$ or boron (via B2H6) at $5 \times 10^{18}$ $cm^{-3}$ may also be a candidate of choice [Ref. 28];

g) forming contacts on top of said doped layer 10c by patterning and etching;

h) removing the readout carrier by conventional etching techniques;

i) opening contacts to the readout electronics by photolithography and dry etching;

j) forming a patterned electrical contact layer 50; and k) providing an optical layer 100 on top of electrical contact layer 50.

It is understood that other fabrication schemes may be implemented. For example there are different methods to adapt and remove carrier wafers. It is understood also that a portion of the fabrication steps may be realized in different orders. The method of fabrication using two wafers I and II is a preferred method. In a variant the realization of the layer stack of the detector array 1 may be realized on a single carrier wafer.

Exemplary Applications

The FPA of the present invention may be used in various types of applications such as ground, airborne and space technology for intelligence, surveillance, military and security systems. It may also be used for spectroscopy, machine vision or non-invasive clinical investigations such as optical coherence tomography. More precisely, the FPA of the present invention can be integrated into and used in methods of the following fields of applications as described below.

LIDAR

System-level benefits of large FPAs are related to providing a large instantaneous field of view and a fully electronic selection by reading out a region of interest (FOV). Large FPAs allow monitoring of large areas and enable key applications, such as high-resolution, wide-area airborne persistent surveillance. The detector larger format with smaller pixel size helps to solve the unmanned—aerial or terrestrial—vehicle (UV) automated "sense and avoid" problem. By using an array of detectors in a FPA, the mechanical scanning needed in single-detector systems can be avoided and because a photon-counting FPA has the ability to digitally time stamp individual photon arrivals it is an enabler for highly sensitive light detection and ranging ("LIDAR") imaging systems. In a LIDAR system the scene is illuminated by a short laser pulse, and imaged onto the FPA, where each single-photon avalanche diode measures photon arrival time, and therefore depth to the corresponding point in the scene whereas the image is built up by combining multiple frames.

Multi/Hyper-Spectral LIDAR Imaging

Most minerals contain distinct absorption features in the SWIR, making this region of the spectrum the best candidate for spectroscopic analysis in many applications. Hydroxyl bearing minerals, sulfates, and carbonate materials produced naturally on earth—or directly related to human activities such as the burning of fossil fuels and the deforestation—are easily identified through SWIR spectroscopy. Multi/hyper-spectral LIDAR imaging can thus provide a powerful tool for mapping, archaeology, earth science, glaciology, agricultural assessment and disaster response.

REFERENCES

1. Assefa S. et al., "CMOS-Integrated 40 GHz Germanium Waveguide Photodetector for On-Chip Optical Interconnects." in Optical Fiber Communication Conference, OSA Technical Digest (CD) (2009);
2. Beeler R. T. et al., "Synthesis and materials properties of Sn/P-doped Ge-on-Si (100): photoluminescence and prototype devices." Chem. Mater. 23, 4480-4486 (2011);
3. Bowers J. E. et al., "High-gain high-sensitivity resonant Ge/Si APD photodetectors.", Proc. of SPIE 7660, 76603 H (2010);
4. Chen L. et al., "High performance germanium photodetectors integrated on submicron silicon waveguides by low temperature wafer bonding." Opt. Express, 16, 11513-11518 (2008);
5. Chen R. et al., "Increased photoluminescence of strain-reduced, high-Sn composition $Ge_{1-x}Sn_x$ alloys grown by molecular beam epitaxy." Appl. Phys. Lett. 99, 181125 (2011);
6. Cheng H. H., Private communication, National Taïwan University (November 2015) quoted in: Pham 2016;
7. Colace L. et al., "Low dark-current germanium-on-silicon near-infrared detectors." IEEE Photonics Technology Letters 19 (22), 1813-1815 (2007);
8. Conley B. R. et al., "Temperature dependent spectral response and detectivity of GeSn photoconductors on silicon for short wave infrared detection." Opt. Express 22, 15639-15652 (2014);
9. Conley B. R. et al., "Si based GeSn photoconductors with a 1.63 NW peak responsivity and a 2.4 µm long-wavelength cutoff." Appl. Phys. Lett. 105 (22), 221117 (2014);
10. Dai D. et al. "Resonant normal incidence separate-absorption-charge-multiplication Ge/Si avalanche photodiodes." Opt. Express 17, 16549-16557 (2009);
11. Dong Y. et al., "Germanium-tin on Si avalanche photodiode: device design and technology demonstration." IEEE Trans. Electron. Dev. 62 (1), 128-135 (2015)
12. Dong Y. et al., "Suppression of dark current in germanium-tin on silicon p-i-n photodiode by a silicon surface passivation technique." Optics Express (23) 18611-18619 (2015);
13. Falub C. V. et al., "Scaling Hetero-Epitaxy from Layers to Three-Dimensional Crystals." Science 335, 1330 (2012);
14. Feng D. et al., "High-speed Ge photodetector monolithically integrated with large cross-section silicon-on-insulator waveguide." Appl. Phys. Lett. 95, 261105 (2009);
15. Ferain I. P. et al., "Low temperature exfoliation process in hydrogen-implanted germanium layers." J. Appl. Phys. 107, 054315 (2010);
16. Flötgen C. et al., "Novel surface preparation methods for covalent and conductive bonded interfaces fabrication", ECS Transactions 64,103-110 (2014);
17. Gassenq F. et al., "GeSn/Ge heterostructure short-wave infrared photodetectors on silicon." Opt. Express 20 (25), 27297-27303 (2012);
18. Grzybowski G. et al., "Next generation of $Ge_{1-y}Sn_y$ (y=0.01-0.09) alloys grown on Si(100) via $Ge_3H_8$ and $SnD_4$: Reaction kinetics and tunable emission." Appl. Phys. Lett. 101(7), 072105 (2012);
19. Hawkins A. R. et al., "High gain-bandwidth product silicon hetero-interface photodetector." Appl. Phys. Lett. 70 (3), 303-305 (1996);
20. Huang Z. et al., "Effectiveness of SiGe buffer layers in reducing dark currents of Ge-on-Si photodetectors." IEEEJ. Quantum Electron. 43(3), 238-242 (2007);
21. Itzler M. et al., "Geiger-mode avalanche photodiode focal plane arrays for three dimensional imaging LADAR." Infrared Remote Sensing and Instrumentation XVIII, Proc. of SPIE Vol. 7808, 78080 C (2010);
22. Jutzi M. et al., "Ge-on-Si vertical incidence photodiodes with 39-GHz bandwidth." IEEE Photonics Technology Letters, 17(7): 1510-1512, (2005);
23. Kang Y. et al., "Monolithic germanium/silicon avalanche photodiodes with 340 GHz gain-bandwidth product." Nature Photonics 3, 59-63 (2009);
24. Kaufmann et al., "Near infrared image sensor with integrated germanium photodiodes." Appl. Phys. 110, 023107 (2011);
25. Kouvetakis J. et al., "Practical materials chemistry approaches for tuning optical and structural properties of group IV semiconductors and prototype photonic devices." IEEE Photon. J. 2(6), 924-941 (2010);
26. Liu Z. et al., "Defect-free high Sn-content GeSn on insulator grown by rapid melting growth." Sci. Rep. 6, 38386 (2016);
27. Lu C. et al., "Yttrium scandate thin film as alternative high-permittivity dielectric for germanium gate stack formation." Appl. Phys. Lett. 107(7), 072904 (2015);
28. Margetis J. et al., "Growth and characterization of epitaxial $Ge_{1-x}Sn_x$ alloys heterostructures using a commercial CVD system." ECS Trans, 64(6), 711 (2014);
29. Mosleh A. et al., "Investigation on the formation and propagation of defects in GeSn thin films." ECS Trans. 64, 1845-1845 (2014);
30. Mosleh A. et al., "Direct growth of $Ge_{1-x}Sn_x$ films on Si using a cold-wall ultra-high vacuum chemical-vapor-deposition system." Front. Mater 2:30, 10.3389 (2015);
31. Oehme M. et al., "GeSn p-i-n detectors integrated on Si with up to 4% Sn." Appl. Phys. Lett. 101(14), 141110 (2012);
32. Oehme M. et al., "GeSn-on-Si normal incidence photodetectors with bandwidths more than 40 GHz." Opt. Express 22(1), 839-846 (2014);
33. Osmond J. et al., "Ultralow dark current Ge/Si (100) photodiodes with low thermal budget." Appl. Phys. Lett. 94, 201106 (2009);
34. Pham T. et al., "Systematic study of Si-based GeSn photodiodes with 2.6 µm detector cutoff for short-wave infrared detection." Opt. Express 24, 4519-4531 (2016);

35. Roucka R. et al. "Direct gap electroluminescence from Si/Ge$_{1-y}$Sn$_y$ p-i-n heterostructure diodes." Appl. Phys. Lett. 98 (6), 061109 (2011);
36. Roucka R. et al., "High-performance near-IR photodiodes: a novel chemistry-based approach to Ge and GeSn devices integrated on silicon." IEEE J. Quantum Electron. 47(2), 213-222 (2011);
37. Schuette D. R. et al., "Hybridization process for back-illuminated silicon Geiger-mode avalanche photodiode arrays." Proc. SPIE 7681 (2010)
38. Tong Q.-Y. et al., "Hydrophobic silicon wafer bonding." Appl. Phys. Lett. 64, 625-627 (1994);
39. Tseng H. H. et al. "GeSn based p-i-n photodiodes with strained active layer on a Si wafer." Appl. Phys. Lett. 103(23), 231907 (2013a);
40. Tseng H. H. et al., "Mid-infrared electroluminescence from a Ge/Ge$_{0.922}$Sn$_{0.078}$/Ge double heterostructure p-i-n diode on a Si substrate." Appl. Phys. Lett. 102(18), 182106 (2013b);
41. Vivien L. et al., "42 GHz p.i.n Germanium photodetector integrated in a silicon-on-insulator waveguide." Opt. Express 17, 6252-6257 (2009);
42. von den Driesch N. et al., "Direct Bandgap Group IV Epitaxy on Si for Laser Applications." Chem. Mater. 27 (13), 4693-4702 (2015);
43. Wang J. and Lee S., "Ge-Photodetectors for Si-Based Optoelectronic Integration." Sensors, 11, 696-718 (2011);
44. Wirths S. et al., "Lasing in direct bandgap GeSn alloy grown on Si." Nature Photon. 9, 88-92 (2015);
45. Zaoui W. S. et al., "Frequency response and bandwidth enhancement in Ge/Si avalanche photodiodes with over 840 GHz gain-bandwidth-product." Opt. Expr. 17(15): 12641 (2009).

The invention claimed is:

1. A short-wave infrared (SWIR) detector array (1), comprising at least one SWIR light conversion layer (10) having a free surface forming an incident light surface (1a) of the detector array (1), and a doped readout wafer (20) being either p-doped or n-doped comprising:
   an array of charge collecting areas (24) being either p-doped or n-doped charge collecting areas (24);
   a readout layer (20c) comprising an electrical circuit (22) and defining a detector lower surface (1b) opposite the incident light surface (1a), said SWIR detector array being configured to detect electromagnetic waves having a wavelength comprised between 1.0 µm and 3.0 µm, wherein
   said SWIR detector array (1) further comprises a support layer (40) to its incident light side, said support layer (40) comprising silicon and being either p-doped or n-doped, the doping of said support layer (40) being different with respect to the doping of said doped readout wafer (20),
   said SWIR detector array (1) further comprises an intermediate layer (30) comprising a p-n junction and a bonding interface (1c-1d), said intermediate layer (30) being arranged in between said support layer (40) and said readout wafer (20),
   said SWIR light conversion layer (10) has a Ge 1-xSnx alloy composition and comprises, to the side away from said intermediate layer (30) a doped contact layer (10c) having a similar doping as said support layer (40), said doped contact layer (10c) being covered by an electrical contact layer (50).

2. The SWIR detector array (1) according to claim 1 wherein said p-n junction is situated to the side of said support layer (40).

3. The SWIR detector array (1) according to claim 1 wherein said p-n junction is situated to the side of said readout layer (2c).

4. The SWIR detector array (1) according to claim 1 wherein said p-n junction comprises said bonding interface and having a first portion situated to the side of said support layer (40) and a second portion situated to the side of said readout layer (10c).

5. The SWIR detector array (1) according to claim 1 wherein said readout electrical circuit (22) is a CMOS type circuit processed in said readout layer (20c) so as to be accessible in said detector lower surface (1b).

6. The SWIR detector array (1) according to claim 1 wherein said light conversion layer (10) has a thickness t1, defined in a direction perpendicular to said support layer (40) of more than 350 nm, preferably more than 1 µm, still preferably more than 10 µm.

7. The SWIR detector array (1) according to claim 1 wherein said support layer (40) is a patterned layer and comprises trenches (42) and elevated regions (44) to its incident light side.

8. The SWIR detector array (1) according to claim 7 wherein said SWIR light conversion layer (10) is internally structured and comprises rods (12) extending between said support layer (40) and said doped contact layer (10c).

9. The SWIR detector array (1) according to claim 8, wherein said rods (12) have, defined in any cross section perpendicular to their length L, a<100> crystallographic orientation.

10. The SWIR detector array (1) according to claim 8 wherein a greatest width of said rods (12), taken in any said cross section, is comprised between 1 µm and 7 µm.

11. The SWIR detector array (1) according to claim 8 comprising, to the incident light side, an optical layer (100) adapted to direct incident light into said rods (12).

12. The SWIR detector array (1) according to claim 11 wherein said optical layer (100) comprises an array of refractive microlens, or an array of diffractive microlenses, or an array of aspheric shaped microlenses, or an array of microprisms or an array of plasmonic planar metalenses allowing for multi/hyper-spectral imaging and analysis.

13. The SWIR detector array (1) according to claim 1 wherein said electrical contact layer (50) is a patterned electrical contact layer (50).

14. The SWIR detector array (1) according to claim 1 wherein the conversion efficiency is higher than 30%, preferably higher than 60%.

15. The SWIR detector array (1) according to claim 1 wherein said absorption layer (10) is realized by a LEP-ECVD technique.

16. A method of fabrication of a SWIR detector array (1) according to claim 1 comprising the steps of:
   a) fabrication of a readout wafer (I) comprising the steps of:
      a1) providing a first silicon wafer (20) being a low doped p or n type SOI wafer comprising a readout layer (20c);
      a2) forming a readout circuit (22) in said readout layer (20c) by a Complementary Metal Oxide Semiconductor (CMOS) process;
      a3) realizing charge collecting areas (24) in said readout layer (20c), said charge collecting areas (24) being n-doped or p-doped with the same doping kind as the SOI wafer;
      a4) planarizing said first silicon wafer (20) to the side of readout layer (20c);

a5) adapting a readout carrier layer to said silicon wafer to the side of said readout layer (20c) by low temperature oxide-to-oxide bonding;
a6) thinning said first silicon wafer (20) by conventional grinding and plasma etching techniques;
a7) providing a smooth, clean and oxide-free bonding surface (1d) by chemical mechanical polishing and passivating, so as to provide said readout wafer (20);
b) fabrication of an absorbing wafer (II) comprising the steps of:
b1) providing a second silicon wafer being a SOI wafer (40) having either a p-type doping or n-type doping opposite to the doping of said charge collecting areas (24);
b2) patterning and passivating the surface of said second wafer so as to form said support layer (40) comprising trenches (42) and elevated regions (44);
b3) depositing, by a LEPECVD process, a SWIR conversion layer (10) made of an Ge1-xSnx alloy composition with a Sn content x between $0.04 \leq x \leq 0.15$ and so that during the deposition process rods (12) are formed having a composition of Ge1-xSnx, said rods (12) having a basis (12b) situated on said elevated regions (44) and having a length L being at least a portion of the thickness t1 of said SWIR light conversion layer (10), said rods having a top surface (1a) opposite to said bottom surface (12b);
b4) passivating the surface of the rods (12) and filling the gaps (14) between said rods (12);
b5) planarizing the upper surface (la) of the SWIR conversion layer (10);
b6) providing by low temperature oxide an absorber carrier wafer on top of the planarized upper surface (1a);
b7) thinning, to a predetermined thickness t2, the formed stack comprising said patterned support layer (40) and said SWIR light conversion layer (10) so as to form said absorber wafer (II);
b8) providing to said absorber wafer (II), a smooth, clean and oxide-free bonding surface (1c) to the side opposite of said upper surface (1a) by conventional surface techniques such as chemical mechanical polishing and wet chemical cleaning;
c) covalently bonding surface (1c) to surface (1d) so as to form a bonding interface (1c-1c) and so that the SWIR detector array comprises an absorber wafer (II) bonded to said readout wafer (I), forming a monolithic detector array unit (1);
d) annealing the monolithic detector array unit (1) to realize hydrogen diffusion across the bonding interface (1c-1c), the annealing being performed by annealing temperatures lower than 350° C.;
e) removing said absorber carrier wafer by conventional etching techniques;
depositing on said SWIR light conversion layer (10), to the side away from said readout wafer (I) a doped layer (10c) having a doping of the type of said patterned support layer (40);

g) forming electrical contacts on top of said doped layer (10c);
h) removing said readout carrier by conventional etching techniques;
i) opening contacts to the readout electronics by photolithography and dry etching;
j) forming a patterned or non-patterned electrical contact layer (50); and
k) providing an optical layer (100) on top of electrical contact layer (50).

17. A method of fabrication of a SWIR detector array (1) according to claim 16 wherein the fabrication steps b1-b8 of an absorbing wafer (II) are replaced by the following steps b1'-b7':
b1') providing a second clean and oxide-free SOI substrate wafer having either a p-type doping or n-type doping opposite to the doping of said charge collecting areas;
b2') depositing by a RP-CVD process a Ge buffer layer on said second silicon wafer;
b3) depositing, by a RP-CVD process, a SWIR conversion layer made of an Ge1-xSnx alloy composition with a Sn content x between $0.04 \leq x \leq 0.15$;
b4') forming a Ge contact layer by RP-CVD and doping;
b5') providing by low temperature oxide bonding a carrier wafer on top of the planarized upper surface;
b6') thinning, to a predetermined thickness t2, the formed stack comprising said patterned layer and said SWIR light conversion layer so as to form said absorber wafer;
b7') providing to said absorbing wafer (II) a smooth, clean and oxide-free bonding surface to the side opposite of said upper surface by conventional surface techniques such as chemical mechanical polishing and wet chemical cleaning.

18. The method according to claim 16 wherein the passivation of the bonding surface (1c) is performed by a low energy hydrogen implantation technique.

19. The method according to claim 16 wherein a doped layer (32) is realized in said absorbing wafer (II) to the side of said bonding surface (1c), said doped layer (32) having the same doping-type as the charge collecting areas (24) to provide a p-n junction within the absorbing wafer (II).

20. The method of claim 16 wherein a doped layer (30) is realized in said readout wafer (20), to the side away from said readout layer (20c), said doped layer having an opposite doping-type as the charge collecting areas (24) so as to provide a p-n junction within the readout wafer (I).

21. The method according to claim 16, wherein in step c) said covalent bonding is realized by a low temperature bonding technique, said low temperature being lower than 300° C.

22. An optical system, comprising said SWIR detector array (1) according to claim 1, arranged to operate in a single-photon counting mode.

23. The optical system according to claim 22 wherein said SWIR detector array is part of a high sensitive LIDAR.

* * * * *